United States Patent
Xie et al.

(10) Patent No.: US 10,381,459 B2
(45) Date of Patent: Aug. 13, 2019

(54) TRANSISTORS WITH H-SHAPED OR U-SHAPED CHANNELS AND METHOD FOR FORMING THE SAME

(71) Applicant: GLOBALFOUNDRIES INC., Grand Cayman (KY)

(72) Inventors: Ruilong Xie, Schenectady, NY (US); Julien Frougier, Albany, NY (US); Yi Qi, Niskayuna, NY (US); Nigel G. Cave, Saratoga Springs, NY (US); Edward J. Nowak, Shelburne, VT (US); Andreas Knorr, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/865,973

(22) Filed: Jan. 9, 2018

(65) Prior Publication Data
US 2019/0214482 A1 Jul. 11, 2019

(51) Int. Cl.
| | | |
|---|---|---|
| *H01L 21/44* | (2006.01) | |
| *H01L 29/66* | (2006.01) | |
| *H01L 29/10* | (2006.01) | |
| *H01L 21/02* | (2006.01) | |
| *H01L 21/308* | (2006.01) | |
| *H01L 29/161* | (2006.01) | |

(Continued)

(52) U.S. Cl.
CPC .. *H01L 29/66598* (2013.01); *H01L 21/02532* (2013.01); *H01L 21/3086* (2013.01); *H01L 29/0673* (2013.01); *H01L 29/1054* (2013.01); *H01L 29/161* (2013.01); *H01L 29/66545* (2013.01); *H01L 29/66818* (2013.01); *H01L 2029/7858* (2013.01)

(58) Field of Classification Search
CPC .......... H01L 21/02532; H01L 21/3026; H01L 29/66598; H01L 29/66545
USPC ........................................................ 438/101
See application file for complete search history.

(56) References Cited

U.S. PATENT DOCUMENTS

| | | |
|---|---|---|
| 2010/0178227 A1 | 7/2010 | Kim et al. |
| 2014/0144541 A1 | 5/2014 | De Carvalho et al. |

(Continued)

FOREIGN PATENT DOCUMENTS

WO 2009118288 A1 1/2009

*Primary Examiner* — David S Blum
(74) *Attorney, Agent, or Firm* — Anthony Canale; Hoffman Warnick LLC

(57) ABSTRACT

A semiconductor structure including a first substantially U-shaped and/or H-shaped channel is disclosed. The semiconductor structure may further include a second substantially U-shaped and/or H-shaped channel positioned above the first channel. A method of forming a substantially U-shaped and/or H-shaped channel is also disclosed. The method may include forming a fin structure on a substrate where the fin structure includes an alternating layers of sacrificial semiconductor and at least one silicon layer or region. The method may further include forming additional silicon regions vertically on sidewalls of the fin structure. The additional silicon regions may contact the silicon layer or region of the fin structure to form the substantially U-shaped and/or H-shaped channel(s). The method may further include removing the sacrificial semiconductor layers and forming a gate structure around the substantially U-shaped and/or substantially H-shaped channels.

11 Claims, 16 Drawing Sheets

(51) Int. Cl.
*H01L 29/06* (2006.01)
*H01L 29/78* (2006.01)

(56) References Cited

U.S. PATENT DOCUMENTS

| | | | |
|---|---|---|---|
| 2019/0019875 A1* | 1/2019 | Tsai | H01L 29/516 |
| 2019/0058050 A1* | 2/2019 | Hsu | H01L 29/6656 |
| 2019/0081145 A1* | 3/2019 | Xie | H01L 29/41783 |

* cited by examiner

TRANSISTORS WITH H-SHAPED OR U-SHAPED CHANNELS AND METHOD FOR FORMING THE SAME

BACKGROUND

The present disclosure relates to semiconductor device fabrication, and more specifically, to U-shaped and/or H-shaped channels for field effect transistors.

Conventional integrated circuits, such as microprocessors, storage devices, etc., include millions of circuit elements including structures such as transistors. Transistors come in a variety of shapes and forms, e.g., planar, fin-type, nanowire, etc. Irrespective of the physical configuration of the transistor device, each transistor comprises source/drain regions in a substrate, and a gate structure defining a channel positioned between the source/drain regions. Transistors may be utilized by applying a predetermined control voltage to the gate structure, causing the portion of the channel in contact with the gate structure and between the source/drain regions to become conductive. The transistors are generally either an N-type (NFET) or P-type (PFET) transistor device wherein the "N" and "P" indicate the type of dopants used to create the source/drain regions of the devices.

As discussed above, transistors come in a variety of shapes and forms. One conventional type of transistor includes a two-dimensional field effect transistor (FET), for example, a planar type transistor in which current flows through the channel region in a substrate between source/drain regions in/on the substrate adjacent to the channel. To provide better control of the current flow, three-dimensional transistor structures are becoming more commonly used as opposed to conventional two-dimensional transistors. Three-dimensional transistors are electronic switching devices in which the channel described with respect to the planar FET is replaced by a fin structure that extends outward, normal to the substrate surface, and between source/drain regions. Generally, in three-dimensional transistors the gate structure that controls current flow in the fin, wraps around three sides of the fin so as to influence the current flow from three surfaces instead of one as in planar FETs. As a result, three-dimensional transistors may exhibit faster switching performance and reduced current leakage which may improve overall performance of the transistors.

More recently, three-dimensional transistors referred to as gate-all-around (GAA) FETs, in which the gate structure surrounds all sides of the channel or fin so as to influence the current flow from every direction are being implemented in integrated circuits. GAA FETs may include channels in the form of nanowires, nanosheets, nanoelipses, etc., and stacks thereof extending between source/drain regions. GAA FET design may allow for reduced short channel effects (SCE), and an overall increase in the performance of the transistors.

One challenge associated with GAA FETs includes scaling of the channel(s). Conventional channel layouts require balancing of competing parameters of the channel (e.g., width (a.k.a., footprint), thickness, and perimeter (a.k.a., effective width, $W_{eff}$)), generally at the expense of one or more of those parameters. For example, in order to increase the perimeter of a channel, the width and/or thickness of the channel may need to be increased beyond a desirable value. Increasing width and/or thickness of the channel may decrease the distance between adjacent channels, and increase the risk of electrical shorts between the structures. Increasing the thickness and/or the width of the channel may also reduce the number of channels that may be formed in a defined region of the semiconductor structure. In another example, increasing the thickness of a channel may contribute to channel bending, and decreased stability. Reducing the perimeter of a channel may also reduce the surface area of the channel in contact with the gate structure and reduce performance of the channel.

SUMMARY

A first aspect of the disclosure is directed to a semiconductor structure, including a semiconductor substrate having an uppermost surface; a first silicon channel above the uppermost surface of the substrate for a field effect transistor (FET), the silicon channel including: a first substantially vertical region extending perpendicular to the uppermost surface of the substrate, a second substantially vertical region extending perpendicular to the uppermost surface of the substrate, the second substantially vertical region laterally separated from the first substantially vertical region, and a first substantially horizontal region extending between the first substantially vertical region and the second substantially vertical region, and parallel to the uppermost surface of the substrate; and a gate structure surrounding a perimeter of the first silicon channel.

A second aspect of the disclosure includes a method including forming a fin structure having a first sidewall, a second sidewall and an uppermost surface above a substrate, the fin structure including: a first sacrificial semiconductor layer above the substrate, a first silicon region on the first sacrificial semiconductor layer, and a second sacrificial semiconductor layer on the first silicon region; forming a shallow trench isolation (STI) above the substrate portion adjacent to the fin structure, wherein an uppermost surface of the STI is positioned below a bottommost extent of the first silicon region; forming a second silicon region extending vertically along the first sidewall of the fin structure, the second silicon region contacting a first surface of the first silicon region; and forming a third silicon region extending vertically along the second sidewall of the fin structure, the third silicon region contacting a second surface the first silicon region.

A third aspect of the disclosure is related to a method including: forming a first isolation material layer on an uppermost surface of a substrate of the semiconductor structure; forming a fin structure having a first sidewall, a second sidewall and an uppermost surface on the first isolation material layer, the fin structure including: a first sacrificial semiconductor layer on the first isolation material layer, a first silicon region on the first sacrificial semiconductor layer, a second sacrificial semiconductor layer on the first silicon region, a second silicon region of the second sacrificial semiconductor layer, and a third sacrificial semiconductor layer on the second silicon region; forming a third silicon region extending vertically along the first sidewall of the fin structure, the third silicon region contacting a first surface of the first silicon region and the second silicon region; forming a fourth silicon region extending vertically along the second sidewall of the fin structure, the fourth silicon region contacting a second surface the first silicon region and the second silicon region; and removing a portion of the third silicon region and the fourth silicon region positioned between the first silicon region and the second silicon region to form a first, lower channel and a second, upper channel positioned above the first, lower channel.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a semiconductor structure including a substantially U-shaped and/or H-shaped channel for a gate-all-around (GAA) field effect transistor (FET). Embodiments of the present disclosure also provide a semiconductor structure including stacked substantially U-shaped and/or H-shaped channels for a GAA complimentary field effect transistor (CFET). Methods according to the disclosure may include forming a fin structure having a stack of alternating sacrificial material layers and silicon layer(s), and epitaxially growing additional vertical silicon regions along sidewalls of the fin structure and contacting the silicon region of the fin structure. Embodiments of the present disclosure may allow for the formation of channels of GAA FET and GAA CFET structures having desirable parameters (e.g., thickness, width, and perimeter). Among other things, embodiments of the present disclosure may also allow for an increased number of channels in a defined area of a semiconductor structure, decreased risk of shorts between channels, and overall improved performance of the FETs.

Referring to the Figures, FIGS. 1-17 show method of forming gate-all-around (GAA) field effect transistors (FETs) having a substantially U-shaped channel, according to embodiments of the disclosure. FIGS. 18-22 show method of forming GAA FETS having a substantially H-shaped channel, according to embodiments of the disclosure. FIGS. 23-28 show forming a complimentary field effect transistor (CFET) having stacked, substantially U-shaped channels. FIGS. 29-32 show forming a CFET having stacked, substantially H-shaped channels.

Figure 1:
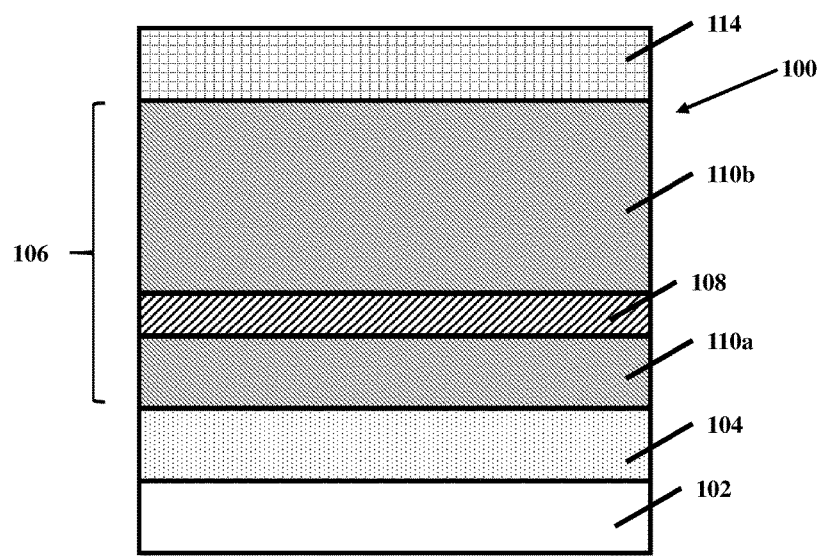
FIG. 1 shows a precursor structure, according to the prior art.

Turning initially to FIG. 1, a precursor structure 100 is shown. In contrast to conventional semiconductor structures, precursor structure 100 may include a set of initial materials to be modified into a field effect transistor (FET) having a substantially U-shaped channel and/or a substantially H-shaped channel, according to the various techniques described herein. FIG. 1 provides a cross-sectional view of precursor structure 100.

Precursor structure 100 may include a substrate 102. As shown, substrate 102 may include any currently-known or later developed material capable of being processed into a functional transistor. For example, substrate 102 may include a bulk semiconductor layer, a semiconductor-on-insulator (SOI) substrate, etc. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained. Substrate 102 of precursor structure 100 may be formed by forming a semiconductor material on an underlying structure. According to an example, substrate 102 may be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As also shown in the example of FIG. 1, precursor structure 100 may further include a buried oxide (BOX) layer 104 positioned on substrate 102. BOX layer 104 may include any conventional semiconductor material for a BOX layer of an SOI structure. For example, BOX layer 104 may include silicon oxide ($SiO_2$). BOX layer 104 may be formed by deposition and/or any other now known or later developed semiconductor fabrication processes for forming a BOX layer.

In the example of FIG. 1, precursor structure 100 may also include a stack 106 of silicon and sacrificial semiconductor layers positioned above BOX layer 104. For example, stack 106 may include alternating layers of silicon and sacrificial semiconductor material for forming and determining the shape and size of a channel for a GAA FET. For example, stack 106 may include a first sacrificial semiconductor layer 110a positioned above BOX layer 104; a first silicon region 108 of stack 106 positioned above first sacrificial semiconductor layer 110a, and a second sacrificial semiconductor layer 110b of stack 106 positioned above first silicon region 108. In precursor structure 100, stack 106 may initially be positioned over the entirety of BOX layer 104. Sacrificial semiconductor layers 110a, 110b may have an identical composition to that of substrate 102, or may be composed of another semiconductor material. For example, in precursor structure 100, sacrificial semiconductor layers 110a, 110b may include without limitation silicon germanium (SiGe).

First sacrificial semiconductor layer 110a, first silicon layer 108, and second sacrificial semiconductor layer 110b may be formed by conventional semiconductor fabrication techniques. In the example of FIG. 1, first sacrificial semiconductor layer 110a of stack 106 may be formed from a silicon layer (not shown) previously formed on BOX layer 104 as part of a SOI structure (not shown) including substrate 102, BOX layer 104, and the silicon layer (not shown). For example, first sacrificial semiconductor layer 110a may be formed by partially recessing, silicon germanium (SiGe) epitaxially growing, and thermally annealing the silicon layer (not shown). Similarly to first sacrificial semiconductor layer 110a, first silicon region 108 and second sacrificial semiconductor layer 110b may be formed by epitaxial growth. For example, first silicon region 108 may be formed by silicon (Si) epitaxial growth of first sacrificial semiconductor layer 110a, and second sacrificial semiconductor layer 110b may be formed by silicon germanium (SiGe) epitaxial growth and thermal annealing of first silicon region 108

Precursor structure 100 may also include a hard mask 114 positioned on the upper surface of second sacrificial semiconductor layer 110b of stack 106. Hard mask 114 may cover stack 106 to protect portions of stack 106 from being removed, etched, altered, etc., during subsequent processing to form substantially U-shaped and/or H-shaped channels. Initially, hard mask 114 may take the form of a single or multiple layer(s) of masking material which coats and overlies the upper surface of second sacrificial semiconductor layer 110b. In precursor structure 100, the entirety of second sacrificial semiconductor layer 110b is initially covered by hard mask 114. Hard mask 114 may include one or more currently known or later developed types of masking materials configured to protect underlying structures from being etched. As examples, hard mask 114 may include without limitation silicon nitride (SiN) and/or silicon dioxide (SiO), or any other hard mask material known in the art.

Figure 2:
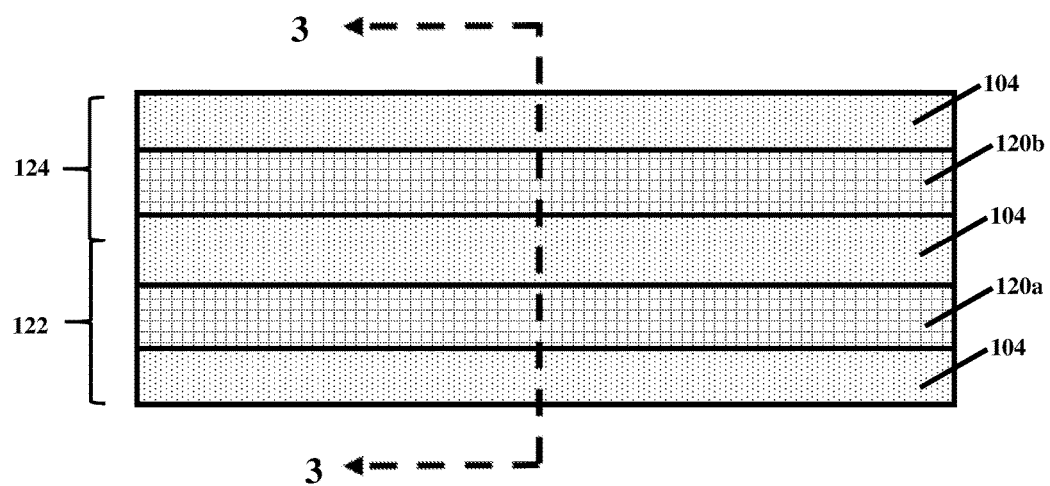
FIG. 2 shows a plan view of forming fin structures from the precursor structure of FIG. 1, according to embodiments of the disclosure.
Figure 3:
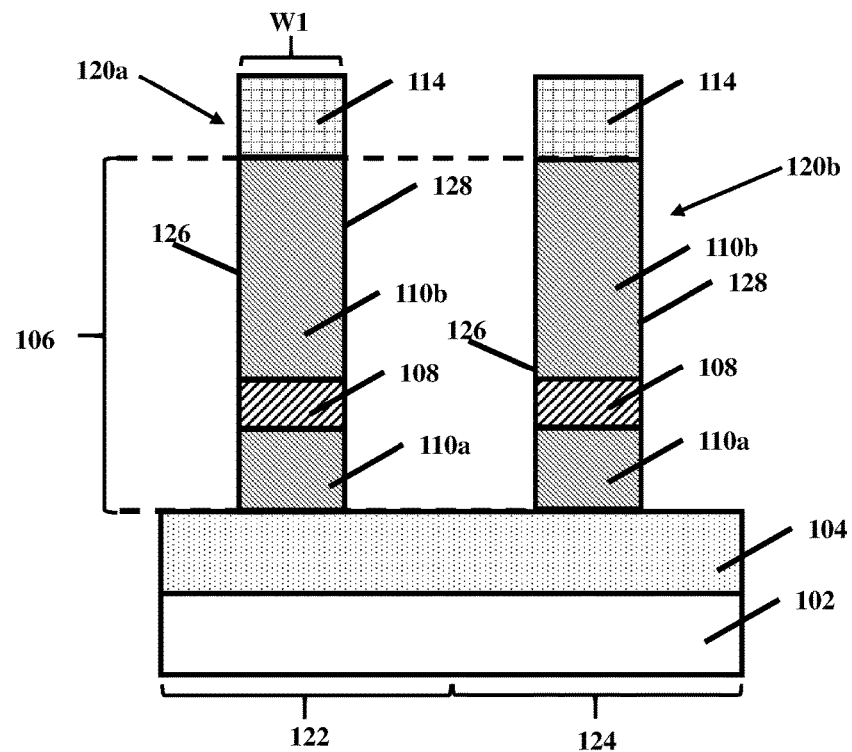
FIG. 3 shows a cross-sectional view of forming the fin structures at structure line 3-3 of FIG. 2, according to embodiments of the disclosure.
Figure 4:
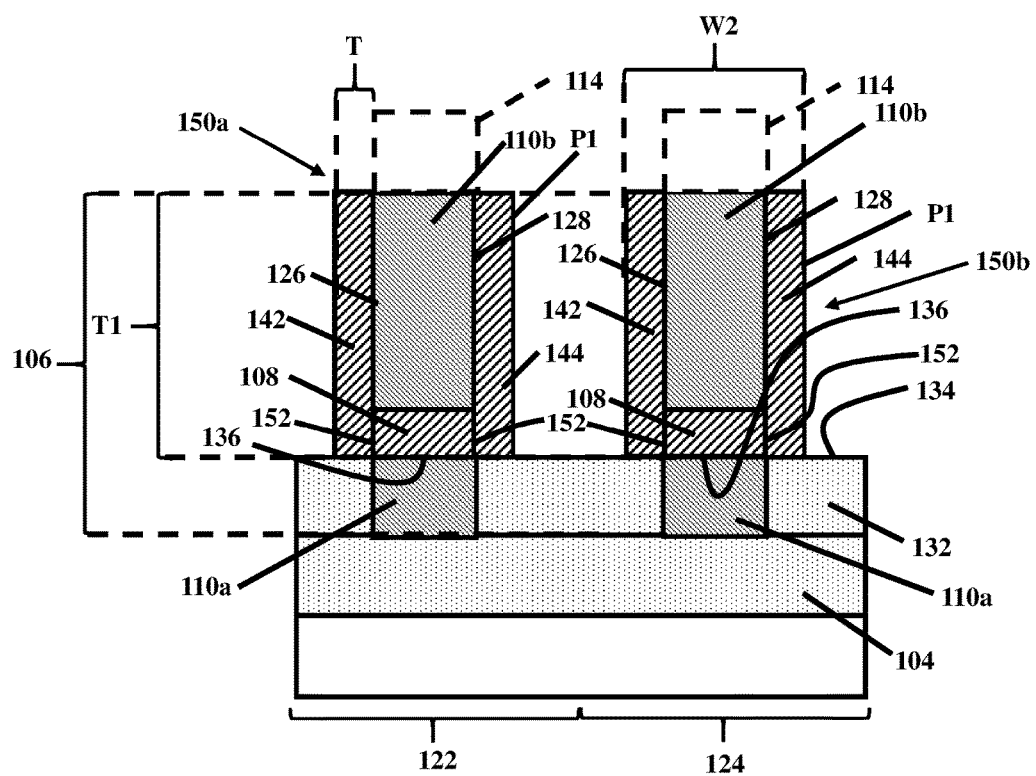
FIG. 4 shows forming substantially U-shaped channels from the fin structures shown in FIG. 3, according to embodiments of the disclosure.

Referring next to FIGS. 2-4 together, embodiments of a method of forming substantially U-shaped channels from precursor structure 100 is shown according to embodiments of the disclosure. Referring to FIGS. 5-17 together, forming GAA FETs including substantially U-shaped channels, according to embodiments of the disclosure is shown. Although two substantially U-shaped channels are shown herein, any number of substantially U-shaped channels for any number, type and/or combination of GAA FETs may be formed according to embodiments of the disclosure.

Turning now to FIGS. 2-3, with FIG. 3 providing a cross-sectional view of the structure line 3-3 in FIG. 2, forming substantially U-shaped channels for GAA FETs may include forming one or more fin structures from precursor structure 100 (FIG. 1).

In the example of FIGS. 2 and 3, two laterally separated fin structures 120a, 120b may be formed on BOX layer 104. As shown in the example of FIG. 3, fin structures 120a, 120b may include vertically extending portions of stack 106 and hard mask 114 positioned on BOX layer 104. Fin structures 120a, 120b may include a first sidewall 126 and a second sidewall 128 on which additional silicon regions may be formed to form substantially U-shaped channels. Fin structures 120a, 120b may be formed, for example, by patterned etching of precursor structure 100 (FIG. 1) using a mask (not shown). Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Fin structure 120a may be positioned in an N-type field effect transistor (NFET) region 122 and subsequently processed to form an NFET. Fin structure 120b may be positioned in a P-type field effect transistor (PFET) region 124 and subsequently processed to form a PFET. As will be described further herein, the formation of an NFET and PFET may include substantially similar processing steps with the exception of the polarity and doping of the substructures of the NFET and PFET, respectively. Although two fin structures 120a, 120b are shown in FIGS. 2 and 3, it is understood that any desirable number of fin structures for any desirable number, type and/or combination of FETs may be formed from precursor structure 100. As also shown in the example of FIG. 3, fin structures 120a, 120b may include a width W1 of approximately 15 nanometers to approximately 40 nanometers which may prevent and/or mitigate bending of the fin structures during subsequent processing in contrast to conventional processes.

Turning next to the cross-sectional view of FIG. 4, forming substantially U-shaped channels may include forming a shallow trench isolation (STI) 132 on exposed portions of the upper surface of BOX layer 104 adjacent to fin structures 120a, 120b. STI 132 may be formed, for example, to protect first sacrificial semiconductor layer 110a and BOX layer 104 from being removed, etched, altered, etc., during subsequent processing of fin structures 120a, 120b. Additionally, STI 132 may allow for first sacrificial semiconductor layer 110a to be accessed for removal during subsequent processing.

As shown, STI 132 may cover at least a portion of first sacrificial semiconductor layer 110a and the entirety of the exposed upper surface of BOX layer 104. In the example of FIG. 4, STI 132 may be formed to entirely cover first sacrificial semiconductor layer 110a such that an uppermost surface 134 of STI 132 is positioned substantially coplanar with a bottommost extent 136 of first silicon region 108. Forming uppermost surface 134 of STI 132 to be substantially coplanar with bottommost extent 136 of first silicon region 108 may allow for a channel having a substantially U-shaped cross-section to be formed. For example, forming STI 132 according to the example of FIG. 4 may prevent additional silicon regions formed on sidewalls 126, 128 of fin structures 120a, 120b from extending below bottommost extent 136 of first silicon region 108 and may allow for substantially U-shaped channels to be formed. As will be discussed later herein, STI 132 may alternatively be formed to cover only a lowermost portion of first sacrificial semiconductor layer 110a for forming substantially H-shaped channels. STI 132 may be formed by conventional semiconductor fabrication techniques for forming an STI. For example, STI 132 may be formed by depositing dielectric material in the STI opening; planarizing any overflow of the dielectric material; and etching back an upper portion of the dielectric material. As used herein, planarization may including chemical mechanical planarization (CMP), i.e., a method of removing layers of solid by chemical-mechanical polishing carried out for the purpose of surface planarization and definition of metal interconnect pattern; key process in back-end of line IC manufacturing. In another non-limiting example, STI 132 may be formed by directional dielectric deposition techniques such as high-density plasma (HDP) deposition or glass cluster ion beam (GCIB) deposition. STI 132 may be filled with conventional materials for an STI fill. As an example, STI 132 may include without limitation, silicon dioxide ($SiO_2$). Although not shown in FIG. 4 for purposes of simplicity, STI 132 may further include a liner formed, for example, by deposition before forming the STI fill.

As also shown in the cross-sectional view of FIG. 4, forming substantially U-shaped channels for GAA FETs may include forming a second silicon region 142 and a third silicon region 144 along the sidewalls of fin structures 120a, 120b. First silicon region 108, second silicon region 142 and third silicon region 144 may together form a substantially U-shaped channel. For example, as shown in the example of FIG. 4, second silicon region 142 and third silicon region 144 may each contact first silicon region 108, forming substantially U-shaped channels 150a, 150b in NFET region 122 and PFET region 124, respectively. Second silicon region 142 may be formed to extend substantially vertically along first sidewall 126 of each fin structure 120a, 120b such that the bottommost portion of second silicon region 142 is positioned on the upper surface of STI 132. Third silicon region 144 may be formed to extend substantially vertically along second sidewall 128 of each fin structure 120a, 120b such that the bottommost portion of the third silicon region is positioned on the upper surface of STI 132. Second silicon region 142 and third silicon region 144 may be formed, for example, by epitaxial growth extending from portions 152 of first silicon region 108 exposed at sidewalls 126, 128 of fin structures 120a, 120b. The thickness of the second and third silicon regions 142, 144 along the sidewalls of fin structures 120a, 120 may be controlled to prevent the regions from merging with neighboring structures. In a non-limiting example shown in FIG. 4, a thickness T of second silicon region 142 may be approximately 4 nanometers to approximately 6 nanometers.

Forming a substantially U-shaped channel may allow for a desirable balance between the competing parameters of the channel. For example, a width W2 and thickness T1 of channels 150a, 150b may be reduced while maintaining and/or increasing the effective perimeter P1 of the channel. In the example of technology nodes beyond 7 nm, substantially U-shaped channels 150a, 150b may include perimeter P1 of approximately 250 nanometers, width W2 of approximately 50 nanometers, and thickness T1 of approximately 30 nanometers. Forming the channel of a GAA FET to be substantially U-shaped may therefore allow for a larger number of GAA FETs to be formed in a defined area of a semiconductor structure, while improving the performance and stability of the GAA FETs. Additionally forming substantially U-shaped channels may allow for a width W1 of fin structures 120a, 120b to be increased to improve structure stability, without compromising the thickness T, width W2 and/or effective perimeter P1 of the channel.

As also shown in FIG. 4, remaining portions of hard mask 114 (in phantom) positioned on the upper surface of fin structures 120a, 120b may be removed after forming substantially U-shaped channels 150a, 150b. Hard mask 114 (in phantom) may be removed to allow for subsequent processing of stack 106, second silicon region 142, and third silicon region 144. For example, hard mask 114 (in phantom) may be removed to allow for formation of a gate structure around substantially U-shaped channels 150a, 150b. Removal of hard mask 114 (in phantom) may include conventional semiconductor fabrication techniques for removing a hard mask. For example, hard mask 114 may be removed by etching (e.g., RIE, hot Phosphoric acid wet etching, etc.).

The next group of processing techniques described herein with respect to FIGS. 5-17 may form GAA FETs including substantially U-shaped channels 150a, 150b. Although the processes described herein with respect to FIGS. 5-17 may include conventional techniques, it should be understood that in contrast to conventional GAA FETs the resulting semiconductor structure may include substantially U-shaped channels 150a, 150b formed according to embodiments of the disclosure.

Figure 5:
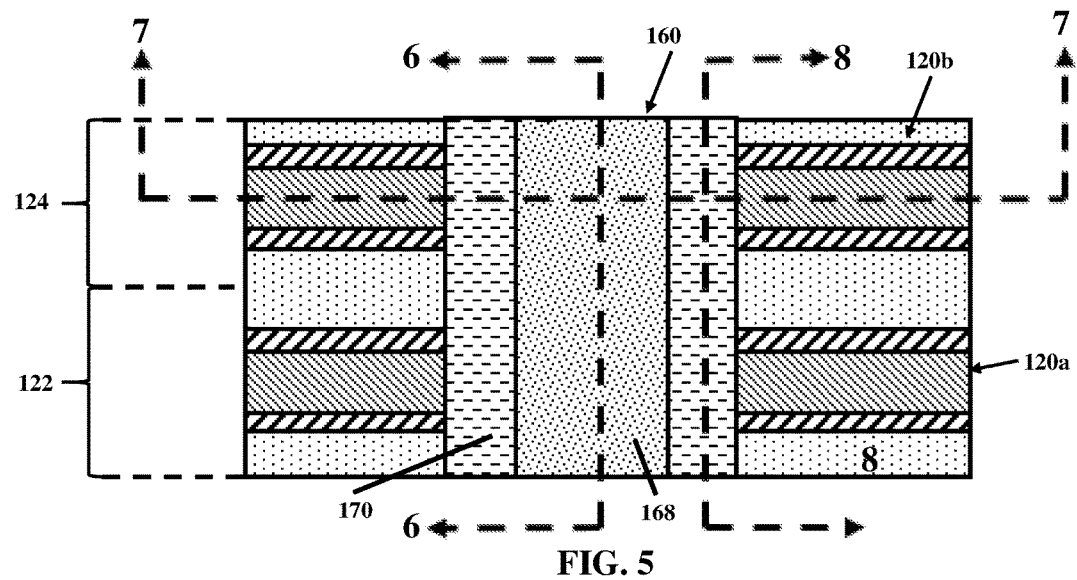
FIG. 5 shows a plan view of forming a dummy gate structure on the structure of FIG. 4, according to embodiments of the disclosure.
Figure 6:
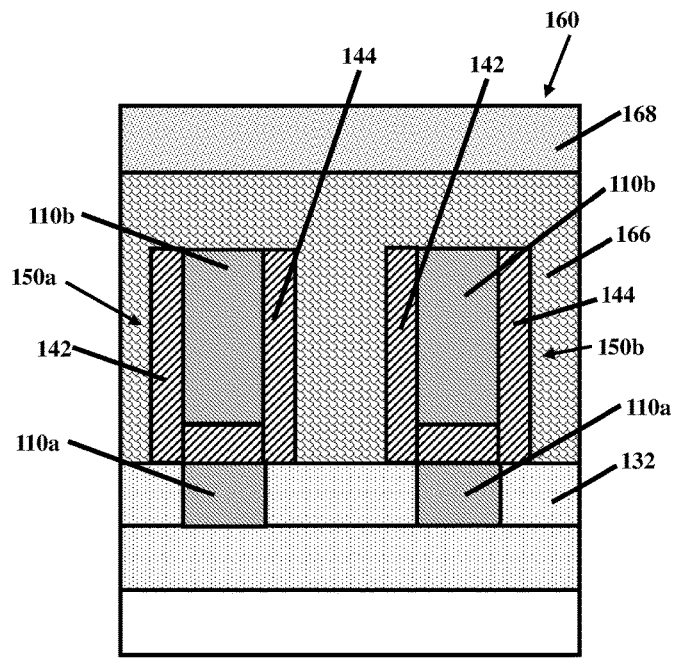
FIG. 6 shows a cross-sectional view of forming the dummy gate structure at structure line 6-6 of FIG. 5, according to embodiments of the disclosure.
Figure 7:
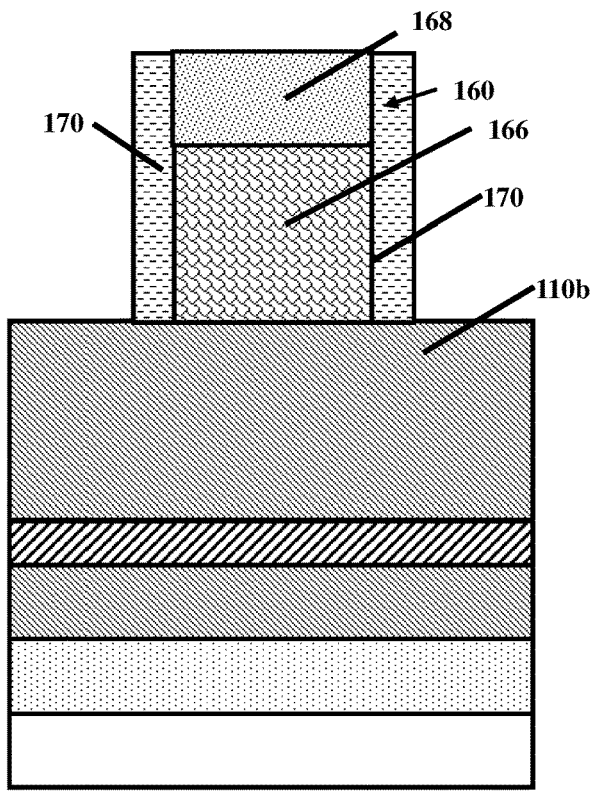
FIG. 7 shows a cross-sectional view of forming the dummy gate structure at structure line 7-7 of FIG. 5, according to embodiments of the disclosure.
Figure 8:
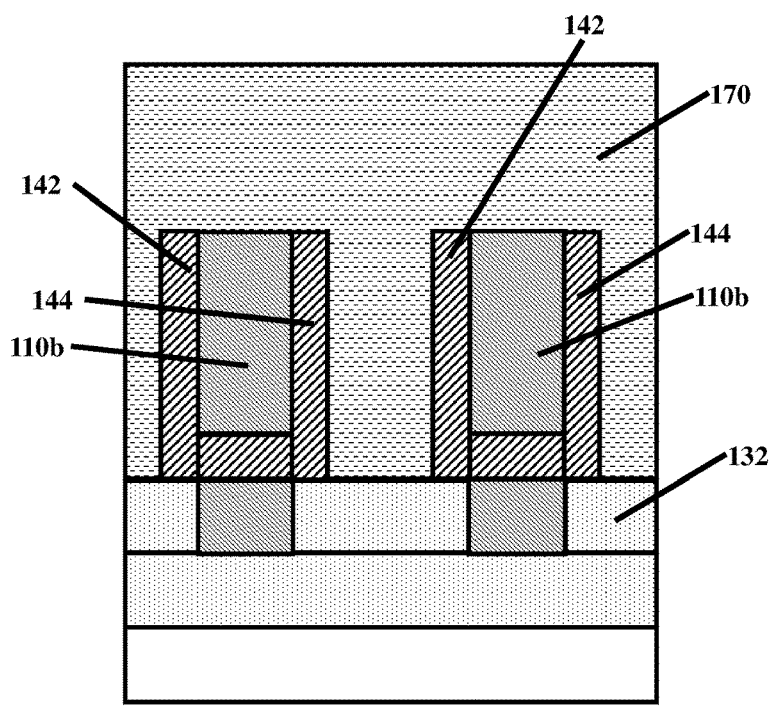
FIG. 8 shows a cross-sectional view of forming the dummy gate structure at structure line 8-8 of FIG. 5, according to embodiments of the disclosure.

Turning now to FIGS. 5-8, with FIG. 6 providing a cross-sectional view of the structure line 6-6 in FIG. 5, FIG. 7 providing a cross-sectional view of the structure line 7-7 in FIG. 5, and FIG. 8 providing a cross-sectional view of the structure line 8-8 in FIG. 5, forming GAA FETs may include forming a dummy gate structure 160 over a portion of the structure of FIG. 4. Dummy gate structure 160 may be formed to protect semiconductor materials positioned thereunder from being removed, etched, altered, etc., during subsequent processing for forming GAA FETs. As best shown in the plan or top view of FIG. 5, dummy gate structure 160 may transverse both fin structures 120a, 120b in NFET region 122 and PFET region 124. As will be discussed herein, dummy gate structure 160 may include a dummy gate body 166 (FIGS. 6 and 7), a dummy gate mask 168 (FIGS. 5-7), and spacers 170 (FIGS. 5, 7 and 8).

Referring to FIGS. 6 and 7 together, dummy gate structure 160 may include dummy gate body 166. Dummy gate body 166 may be subsequently removed for replacement by a replacement metal gate (RMG) structure for a GAA FET. As shown in the examples of FIGS. 6 and 7, dummy gate body 166 may be formed on the upper surface of second sacrificial semiconductor layer 110b, portions of second and third silicon regions 142, 144 (FIG. 6 only), and the upper surface of STI 132 (FIG. 6 only). Dummy gate body 166 may include conventional semiconductor materials for a dummy gate body. For example, dummy gate body 166 may include without limitation, amorphous silicon (a-Si) on a silicon dioxide ($SiO_2$) layer. Dummy gate body 166 may be formed by conventional semiconductor fabrication techniques for forming a gate body for a dummy gate structure. In the example of FIGS. 6 and 7, dummy gate body 166 may be formed by deposition and etching using a dummy gate mask 168. For example, dummy gate body material may be deposited; dummy gate mask 168 may be formed over the portion of the dummy gate body material desired to remain to form dummy gate body 166; and the portion of the dummy gate body material not covered by dummy gate mask 168 may be removed by etching. As shown in FIGS. 6 and 7, dummy gate mask 168 may remain on dummy gate body 166 after the etching. Dummy gate mask 168 may protect dummy gate body 166 from being removed, etched, altered, etc., during subsequent processing of the semiconductor structure, e.g., during the formation of source/drain regions of the GAA FETs. Dummy gate mask 168 may be formed by conventional semiconductor fabrication techniques for forming a cap. In the example of FIGS. 5-7, dummy gate mask 168 may be formed by deposition. Dummy gate mask 168 may include conventional semiconductor materials for a dummy gate mask. For example, dummy gate mask 168 may include without limitation silicon nitride (SiN). As discussed above, it should be understood that although not shown in the cross-section of FIG. 7, dummy gate body 166 and dummy gate mask 168 may be formed in NFET region 122 (FIG. 5) on the same and/or similar structures by the same and/or similar processes and materials.

Although not shown for purposes of simplicity, an oxide layer may be formed on the upper surface of second sacrificial semiconductor layers 110a, 110b, first and second silicon regions 142, 144, and the upper surface of STI 132 in NFET region 122 and PFET region 124 before forming dummy gate body 166. The oxide layer may protect the structures thereunder from damage during subsequent processing of dummy gate structure 160. The oxide layer may include conventional semiconductor materials for an oxide layer. For example, the oxide layer may include without limitation silicon oxide (SiO).

Referring next, to FIGS. 5, 7, and 8, dummy gate structure 160 may further include spacers 170. Spacers 170 may be formed on the sides of dummy gate body 166 and dummy gate mask 168 to provide distance between subsequently formed source/drain regions on one side of the spacers, and the gate and channel region on the other side of the spacer. Spacers 170 may also protect semiconductor materials covered by the spacers from being removed, etched, altered, etc., during subsequent processing (e.g., during the formation of source/drain regions for the GAA FETs). As best shown in FIG. 7, spacers 170 may be formed along the sidewalls of dummy gate body 166, and dummy gate mask 168. As best shown in FIG. 8, spacers 170 may also be formed on the upper surface of second sacrificial semiconductor layer 110b, portions of first and second silicon regions 142, 144, and the upper surface of STI 132. Spacers 170 may be formed by conventional semiconductor fabrication techniques for forming spacers of a gate structure. In the example of FIGS. 5, 7, and 8, spacers 170 may be formed by conformal dielectric deposition, followed by anisotropic etch. Spacers 170 may include conventional semiconductor materials for spacers. For example, spacers 170 may include without limitation SiBCN, SiCO, and/or any other now known or later developed materials for spacers for a gate structure. Although not shown in the cross-section of FIG. 8, it should be understood that spacers 170 may be formed in NFET region 122 on the same and/or similar structures by the same and/or similar processes and materials.

Figure 9:
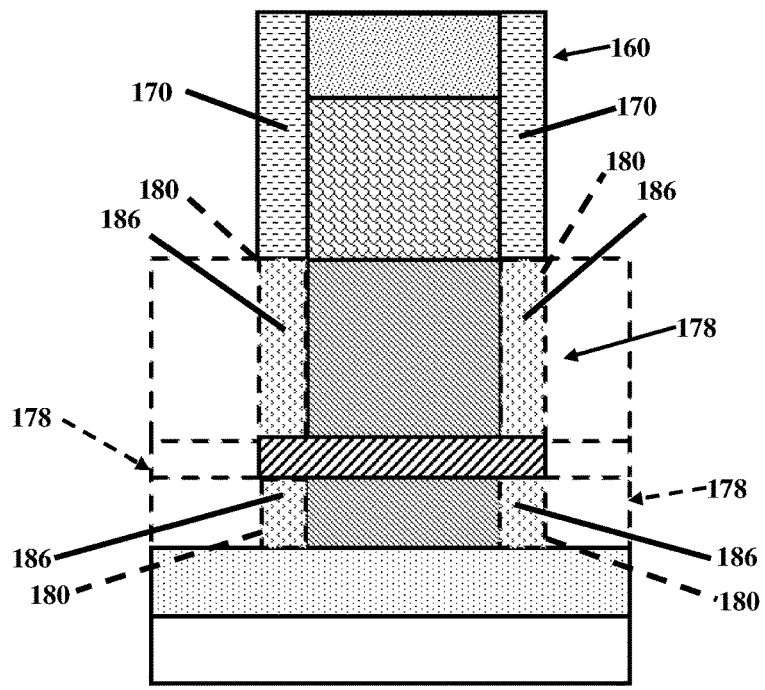
FIG. 9 shows a cross-sectional view forming inner spacers under the dummy gate structure of FIGS. 5-8 at the same perspective of structure line 7-7 of FIG. 5, according to embodiments of the disclosure.

Turning next to FIG. 9, with FIG. 9 providing a cross-sectional view along the same perspective of structure line 7-7 of FIG. 5, after forming dummy gate structure 160, portions of stack 106 may be removed. For example, portions 178 of stack 106 (i.e., portions of first silicon region 108, first sacrificial semiconductor layer 110a, and second sacrificial semiconductor layer 110b in phantom) not covered by dummy gate structure 160 and spacer 170 may be removed. Portions 178 (in phantom) may be removed to expose portions 180 of stack 106 positioned below dummy gate structure 160 for subsequent processing. Portions 178 (in phantom) may be removed by conventional semiconductor fabrication techniques for removing sacrificial materials and silicon. For example, portions 178 may be removed by patterned etching using dummy gate structure 160 and spacer 170 as a mask.

As also shown in FIG. 9, forming GAA FETs may further including removing portions 180 (in phantom) of first and second sacrificial semiconductor layers 110a, 110b positioned under spacers 170. Portions 180 (in phantom) of the sacrificial semiconductor layers may be removed for replacement by an inner spacer as will be discussed later herein. Portions 180 (in phantom) of first and second sacrificial semiconductor layers 110a, 110b may be removed by conventional semiconductor fabrication techniques for removing sacrificial semiconductor materials. For example, portions 180 (in phantom) may be removed by selective etching the silicon germanium (SiGe) to surrounding materials.

Figure 10:
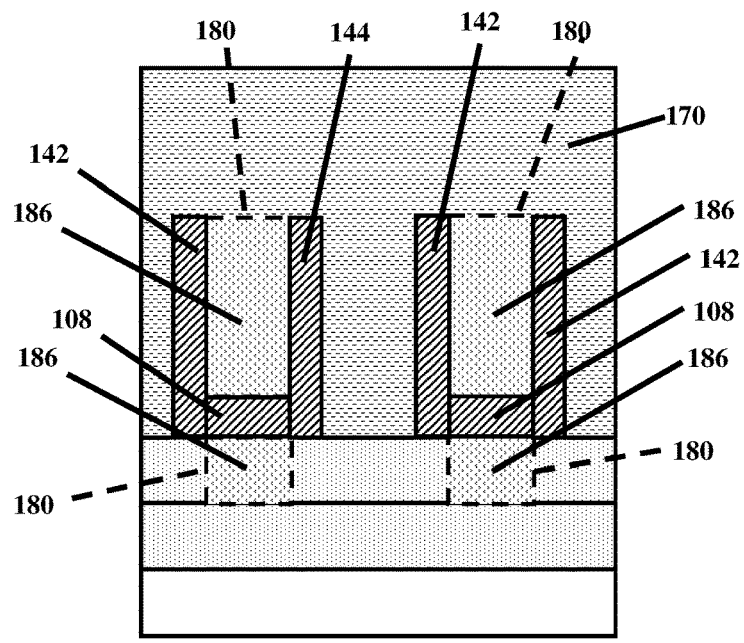
FIG. 10 shows a cross-sectional view forming the inner spacers under the dummy gate structure of FIGS. 5-8 at the same perspective of structure line 8-8 of FIG. 5, according to embodiments of the disclosure.

Referring next to FIGS. 9 and 10 together, with FIG. 10 providing a cross-sectional view along the same perspective of structure line 8-8 of FIG. 5, forming GAA FETs may include forming inner spacers 186 under spacers 170 in place of removed portions 180 (in phantom) of sacrificial semiconductor layers 110a, 110b. Inner spacers 186 may be formed to isolate sacrificial semiconductor layers 110a, 110b under dummy gate body 166 from subsequently formed source/drain region. Additionally, inner spacers 186 may prevent replacement metal gate (RMG) materials from subsequently being formed over the source/drain regions. As shown in FIG. 10, inner spacers 186 may be formed below spacers 170. Inner spacers 186 may extend between second and third silicon regions 142, 144; spacers 170 and first silicon region 108; and first silicon region 108 and BOX layer 104. Inner spacers 186 may be formed by conventional semiconductor fabrication techniques for forming an inner spacer. In the example of FIGS. 9 and 10, inner spacer 186 may be formed by conformal deposition of inner spacer material to pinch-off the space in the divots under spacers 170, and removing the spacer material elsewhere. Inner spacers 186 may include conventional semiconductor materials for an inner spacer. For example, inner spacers 186 may include without limitation silicon nitride (SiN). Although shown in FIGS. 9 and 10 as a solid region of silicon nitride (SiN), in another non-limiting example not shown, inner spacers 186 may alternatively include a thin liner of silicon nitride (SiN), and an air-gap.

Figure 11:
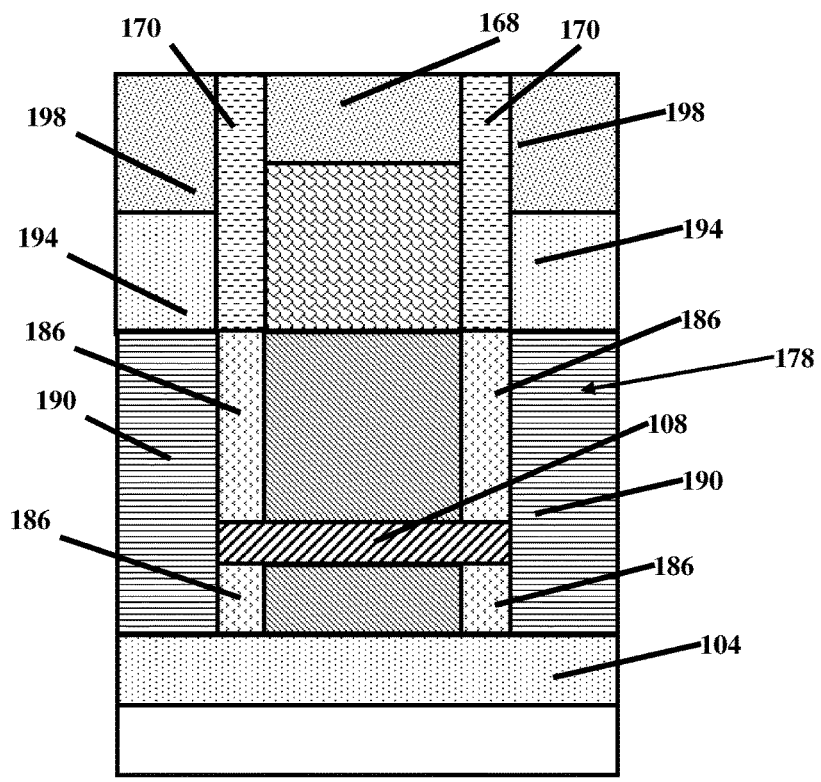
FIG. 11 shows a cross-sectional view of forming source/drain regions at the same perspective of structure line 7-7 of FIG. 5, according to embodiments of the disclosure.

Turning next to FIG. 11, with FIG. 11 providing a cross-sectional view along the same perspective of structure line 7-7 of FIG. 5, once inner spacers 186 have been formed, forming GAA FETs may include forming source/drain regions 190 for GAA FETs. Source/drain regions 190 may be formed on the upper surface of BOX layer 104 adjacent to inner spacers 186. As shown in FIG. 11, source/drain regions 190 may be formed as contacting portions of substantially U-shaped channel 150b (e.g., first silicon region 108 in FIG. 11) such that the substantially U-shaped channel extends between the source/drain regions. Although shown in FIG. 11 with respect to a cross-sectional view of PFET region 124 in FIG. 11, source/drain regions 190 may also be formed adjacent to and contacting inner spacers 186 in NFET region 122.

Source/drain regions 190 may be formed by conventional semiconductor fabrication techniques for forming a source/drain region for a GAA FET. In the example of FIG. 11, source/drain regions 190 may be formed in PFET region 124 as P-type source/drain regions for a subsequently formed PFET. For example, although not shown, after inner spacers 186 (FIG. 10) are formed a liner may be formed to cover both NFET region 122 (FIG. 5) and PFET region 124; the liner may be removed from PFET region 124 using a mask; and source/drain regions 190 may be formed in PFET region 124. Formation of the source/drain regions of a PFET may include in-situ P-type doping during epitaxial growth from substantially U-shaped channel 150b, and thus may be referred to as "P-type source/drain regions." For example, a P-type element is introduced to the semiconductor to generate free hole (by "accepting" electron from semiconductor atom and "releasing" hole at the same time). The P-type dopants may include without limitation boron (B), indium (In), and gallium (Ga). The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces. Source/drain regions 190 formed in PFET region 124 as P-type source/drain regions may include silicon germanium and/or any other now known or later developed stressor for generating compressive stress in the channel of the subsequently formed PFET to enhance the mobility of the holes created by the P-type dopant.

Although not shown in the cross-sectional view of FIG. 11, source drain regions 190 may also be formed in NFET region 122 (FIG. 5) as N-type source/drain regions for a subsequently formed NFET. Source/drain regions 190 may be formed in NFET region 122 (FIG. 5) by similar methods as discussed above with respect to source/drain regions 190 in PFET region 124, with the exception of source/drain region material, the dopant used to dope the region, and U-shaped channel from which the S/D regions may be formed. For example, after source/drain regions 190 (FIG. 11) have been formed in PFET region 124 as discussed above, another liner may be formed over both NFET region 122 (FIG. 5) and PFET region 124 (FIG. 5); the liner may be removed over NFET region 122; and source/drain regions may be formed in NFET region 122 (FIG. 5) For example, source/drain regions 190 may be formed in NFET region 122 by in-situ N-type doping during epitaxial growth from U-shaped channel 150a (FIG. 8) and thus may be referred to as "N-type source/drain regions". The N-type dopants may include but are not limited to, for example, phosphorous (P), arsenic (As), antimony (Sb), etc. Portions of source/drain region 190 formed in NFET region 122 (FIG. 5) may include, for example, silicon phosphorus (SiP), and/or any other now known or later developed material for forming an N-type source/drain region.

As also shown in FIG. 11, forming GAA FETs may include forming a region of insulating materials to insulate source/drain regions 190 from overlaying materials and/or structures. For example, an interlayer dielectric (ILD) 194 may be formed to cover source/drain regions 190. In the example of FIG. 11, ILD 194 may include one or more layers, films, etc., of dielectric material appropriate for structurally separating distinct layers of a semiconductor structure. For example, ILD 194 may include without limitation a single layer of an oxide. In another non-limiting example not shown, ILD 194 may include multiple layers such as a thin silicon nitride (SiN) layer followed by silicon oxide (SiO$_2$) layer positioned on the SiN layer ILD may be formed by conventional semiconductor fabrication techniques for forming an insulator layer. For example, ILD 194 may be formed by deposition, planarization (e.g., CMP), and etching back excess material.

As further shown in FIG. 11, after forming ILD 194, a cap layer 198 may be formed above source/drain regions 190 and ILD 194 to protect the layers from being removed, etched, altered, etc., during subsequent processing (e.g., during the removal of dummy gate structure 160 and formation of a replacement metal gate (RMG) structure). Cap layer 198 may include conventional semiconductor materials for protecting regions of a semiconductor structure. For example, cap layer 198 may include without limitation silicon nitride (SiN). Cap layer 198 may be formed by conventional semiconductor fabrication techniques for forming a cap layer. In the example of FIG. 11, cap layer 198 may be formed by deposition and planarization by way of chemical mechanical polishing (CMP) or a similar process such that the top surface of cap layer 198 is substantially co-planar with the upper surface of spacers 170 adjacent thereto. It should be understood that although not shown, ILD 194 and cap layer 198 may also be formed in NFET region 122 by the same and/or similar processes and materials.

Figure 12:
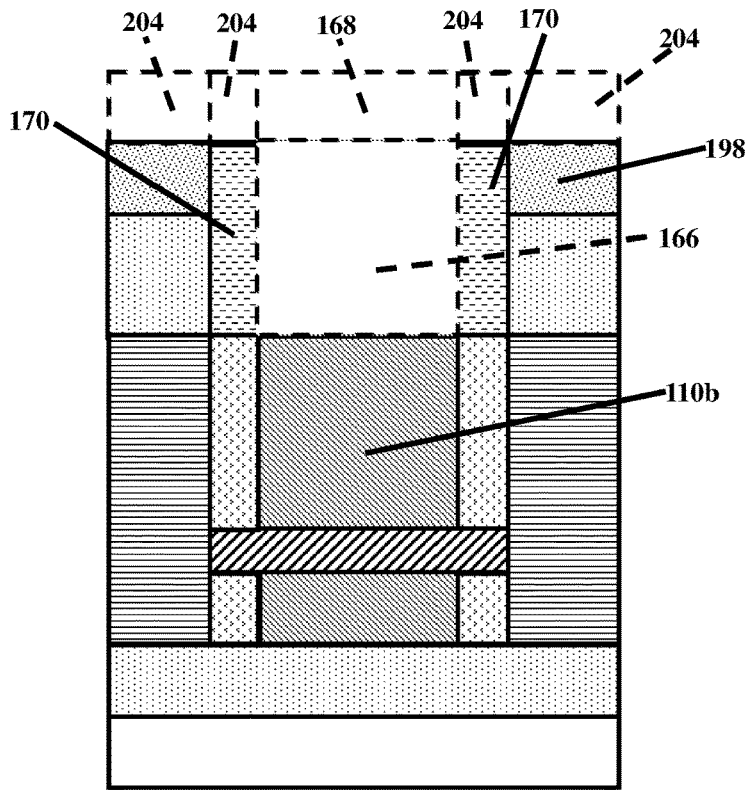
FIG. 12 shows a cross-sectional view of removing the dummy gate structure of FIGS. 5-8 at the same perspective of structure line 7-7 of FIG. 5, according to embodiments of the disclosure.
Figure 13:
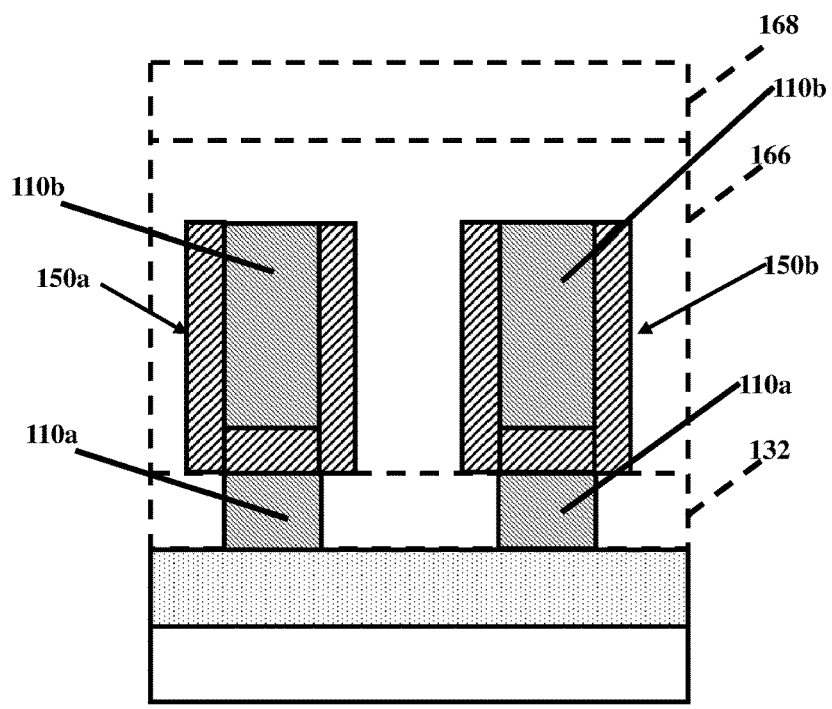
FIG. 13 shows a cross-sectional view of removing the dummy gate structure of FIGS. 5-8 at the same perspective of structure line 6-6 of FIG. 5, according to embodiments of the disclosure.
Figure 16:
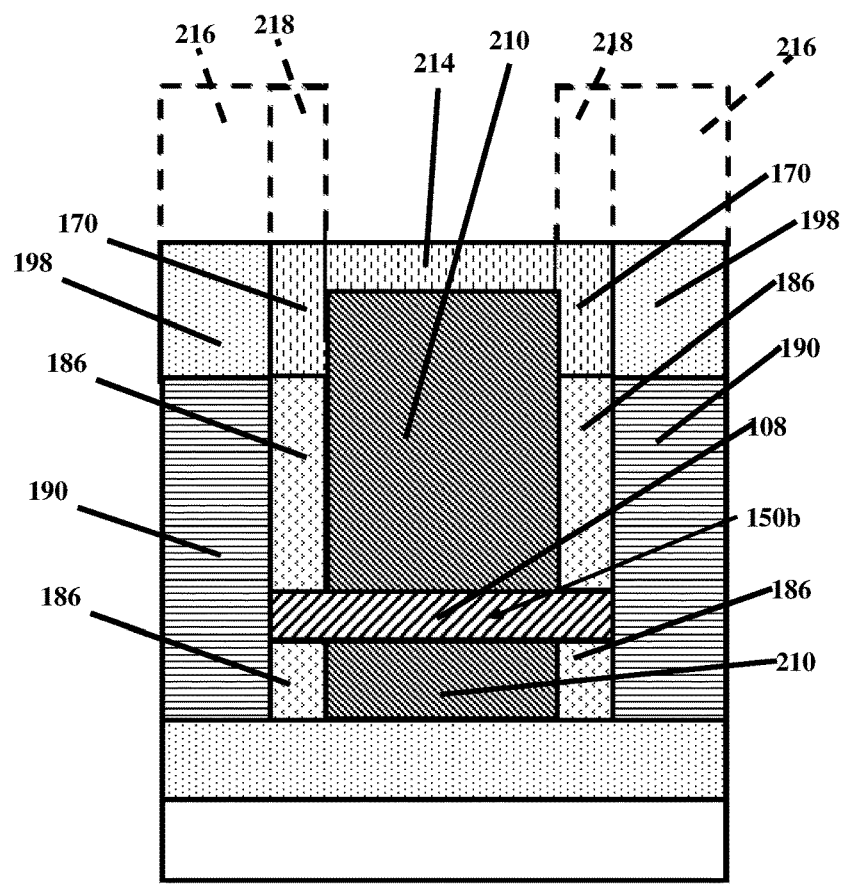
FIG. 16 shows a cross-sectional view of forming a replacement metal gate structure at the same perspective of structure line 7-7 of FIG. 5, according to embodiments of the disclosure.
Figure 17:
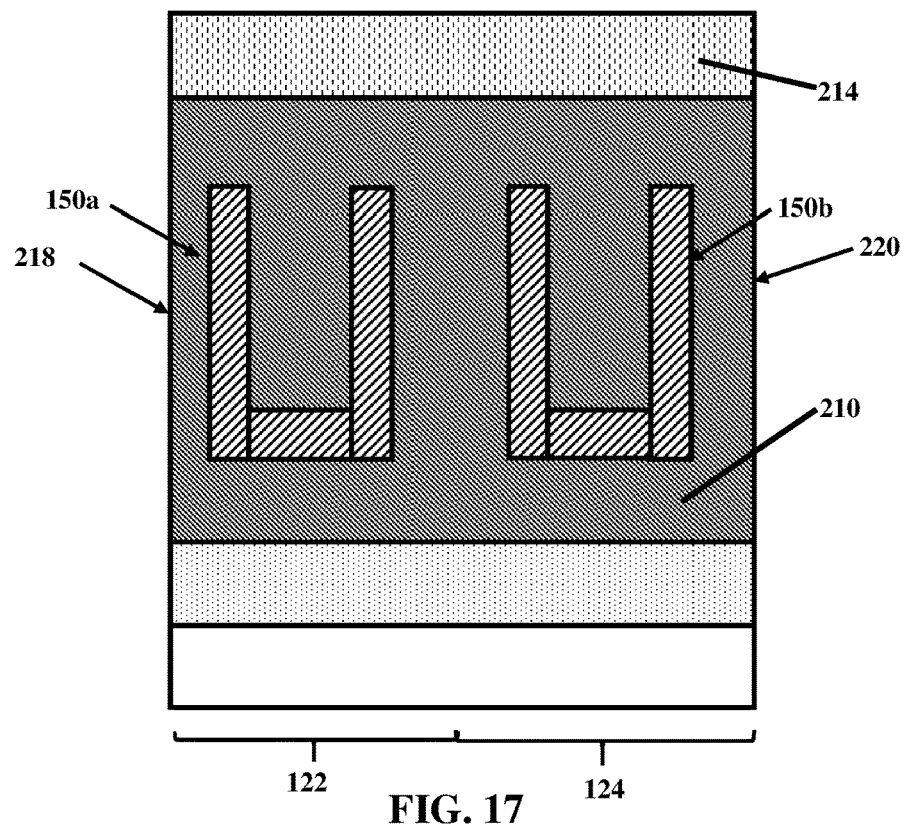
FIG. 17 shows a cross-sectional view of forming the replacement metal gate structure at the same perspective of structure line 6-6 of FIG. 5, according to embodiments of the disclosure.

Turning next to FIGS. 12 and 13, with FIG. 12 providing a cross-sectional view along the same perspective of structure line 7-7 of FIG. 5, and FIG. 13 providing a cross-sectional view along the same perspective of structure line 6-6 of FIG. 5, forming GAA FETs according to embodiments of the disclosure may further include removing dummy gate body 166 (in phantom) and dummy gate mask 168 (in phantom). Dummy gate body 166 (in phantom) and dummy gate mask 168 (in phantom) may be removed to allow for formation of a replacement metal gate (RMG) structure (e.g., RMG structure 210 of FIGS. 16 and 17) around substantially U-shaped channels 150a, 150b (FIG. 13). For example, as shown in FIGS. 12 and 13, removing dummy gate body 166 (in phantom) and dummy gate mask 168 (in phantom) may expose portions of second sacrificial semiconductor layer 110b for removal and replacement by RMG structure 210 (FIGS. 16 and 17). As best shown in the cross-section of FIG. 13, removing dummy gate body 166 (in phantom) and dummy gate mask 168 (in phantom) may also expose portions of substantially U-shaped channels 150a, 150b for formation of RMG structure 210 (FIGS. 16 and 17) therearound. Dummy gate body 166 (in phantom) and dummy gate mask 168 (in phantom) may be removed by conventional semiconductor fabrication techniques for removing a dummy gate body and cap. For example, dummy gate body 166 (in phantom) and dummy gate mask 168 (in phantom) may be removed by selective etching.

As also shown in the cross-section of FIG. 12, portions 204 (in phantom) of cap layer 198, and spacers 170 may also be removed during the removal of dummy gate body 166 (in phantom) and dummy gate mask 168 (in phantom), preventing damage to portions of the semiconductor structure positioned thereunder. Although not shown in FIG. 13, spacers 170 (FIG. 10) may remain intact at cross-sections into and out of the plane of the page after removal of the dummy gate body and dummy gate cap.

Referring next to FIG. 13, after removing dummy gate body 166 (in phantom) and dummy gate mask 168 (in phantom), STI 132 (in phantom) may be removed. Removing STI 132 may, for example, expose first sacrificial semiconductor layer 110a for removal and replacement by RMG structure 210 (FIGS. 16 and 17). STI 132 may be removed by conventional semiconductor fabrication techniques for removing an STI. For example, STI 132 may be removed by etching. Although not shown in the cross-sectional view of FIG. 13, spacers 170 (FIG. 10) may continue to remain intact at cross-sections into and out of the plane of the page after removal of STI 132.

Figure 14:
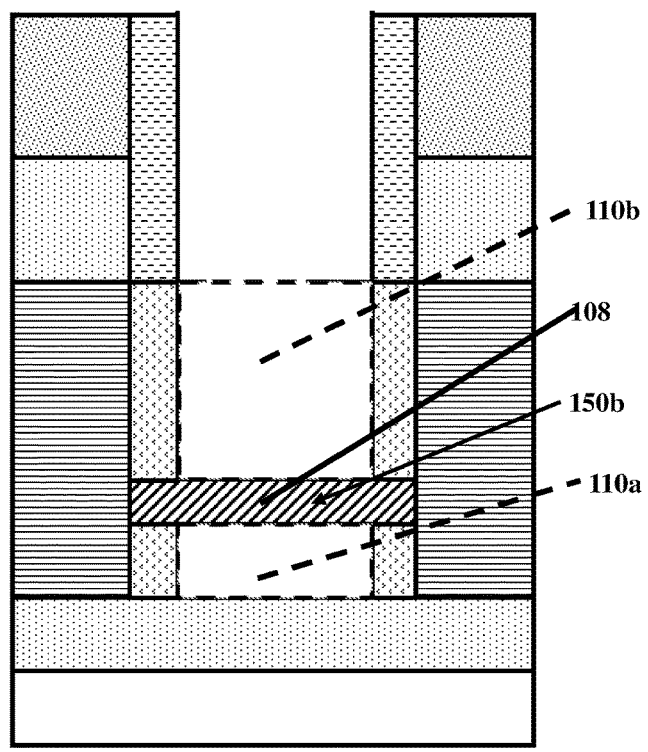
FIG. 14 shows a cross-sectional view of removing a sacrificial portion of the fin structures at the same perspective of structure line 7-7 of FIG. 5, according to embodiments of the disclosure.
Figure 15:
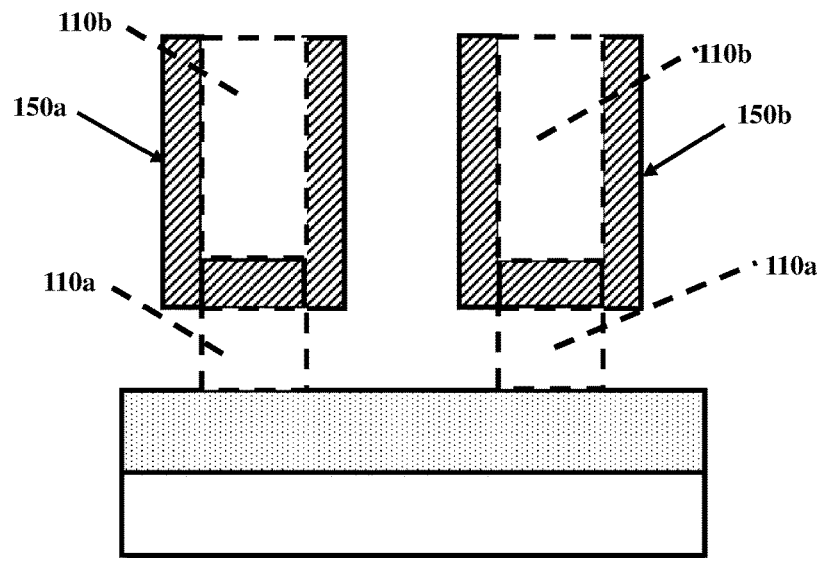
FIG. 15 shows a cross-sectional view of removing the sacrificial portion of the fin structures at the same perspective of structure line 6-6 of FIG. 5, according to embodiments of the disclosure.

Turning to FIGS. 14 and 15, with FIG. 14 providing a cross-sectional view along the same perspective of structure line 7-7 of FIG. 5, and FIG. 15 providing a cross-sectional view along the same perspective of structure line 6-6 of FIG. 5, forming GAA FETs may further include removing first and second sacrificial semiconductor layers 110a, 110b (in phantom) to allow for formation of RMG structure 210 (FIGS. 16 and 17) around substantially U-shaped channels 150a, 150b. For example, as shown in FIG. 15, removing sacrificial semiconductor layers 110a, 110b (in phantom) may expose substantially U-shaped channels 150a, 150b. Sacrificial semiconductor layers 110a, 110b (in phantom) may be removed by conventional semiconductor fabrication techniques for removing a sacrificial semiconductor material. For example, sacrificial semiconductor layers 110a, 110b may be removed by selective etching. Although not shown in the cross-sectional view of FIG. 15, spacers 170 (FIG. 10) may continue to remain intact at cross-sections into and out of the plane of the page after removal of the sacrificial semiconductor layers.

Turning next to FIGS. 16 and 17, with FIG. 16 providing a cross-sectional view along the same perspective of structure line 7-7 of FIG. 5, and FIG. 17 providing a cross-sectional view along the same perspective of structure line 6-6 of FIG. 5, forming GAA FETs may include forming a replacement metal gate (RMG) structure 210 around substantially U-shaped channels 150a, 150b between source/drain regions 190 and inner spacers 186. As best shown in the example of FIG. 17, RMG structure 210 may surround perimeter P1 of substantially U-shaped channels 150a, 150b and may therefore be referred to as a "gate-all-around" (GAA) structure. RMG structure 210 may be formed around substantially U-shaped channels 150a, 150b to form functional GAA FET structures. For example, applying a predetermined control voltage to RMG structure 210 may cause surrounded portions of substantially U-shaped channels 150a, 150b to become conductive between source/drain regions 190. RMG structure 210 may be formed by conventional semiconductor fabrication techniques for forming a RMG structure. For example, RMG structure 210 may be formed by deposition. RMG structure 210 may include conventional semiconductor materials for an RMG structure. For example, RMG structure 210 may include without limitation, gate dielectric insulator materials such as hafnium oxide (HfO2); work function metals such as titanium nitride (TiN), tantalum nitride (TaN), titanium aluminide (TiAl); and/or conductive metals such as tungsten (W), cobalt (Co) or ruthenium (Ru).

As also shown in FIGS. 16 and 17, a replacement metal gate (RMG) cap layer 214 may be formed on the upper surface of RMG structure 210 between spacers 170 to protect the RMG structure from being removed, etched, altered, etc., during subsequent processing of the semiconductor structure. RMG cap layer 214 may be formed by conventional semiconductor fabrication techniques for forming a cap layer. For example, RMG cap layer 214 may be formed by recessing the RMG metal, followed by dielectric deposition, and planarization by way of chemical mechanical polishing (CMP), or a similar process such that the top surface of the RMG cap layer 214 is substantially co-planar with the upper surface of ILD 194. As best shown in FIG. 16, portions 216 (in phantom) of cap layer 198 and portions 218 (in phantom) of spacers 170 may also be removed during the planarization of RMG cap layer 214, protecting the semiconductor structures positioned thereunder.

Referring to FIG. 17, processes of the disclosure may form a GAA NFET 218 in NFET region 122 and a GAA PFET 220 in PFET region 124. In contrast to conventional GAA FETs, GAA NFET 218 and GAA PFET 220 may include substantially U-shaped channels 150a, 150b, respectively. Among other things, forming GAA NFET 218 and GAA PFET 220 to include substantially U-shaped channels may, for example, allow for increased contact area between a gate structure (RMG structure 210) and a channel (substantially U-shaped channels 150a, 150b), increasing performance of the GAA FET. Strictly for purposes of convenience, the processes and structures discussed above with respect to FIGS. 1-17 will be referred to hereinafter as "the UFETs."

Before proceeding to discussion of subsequent processing techniques, structures and accompanying FIGS., it is noted that the various techniques relative to the UFETs may be applied and depicted together in one of FIGS. 18-23, and that the various processing techniques described herein may be combined and/or substituted where appropriate without departing from the underlying technical concepts and characteristics of the present disclosure. It is again emphasized that the processes discussed herein and shown in the accompanying FIGS. 18-23 reflect a similar set of processing concepts with possible variances in implementation discussed herein. It should also be noted that structures described herein with respect to FIGS. 18-22 having the same reference numbers as structures described above with respect to the UFETs may be formed by the same and/or similar methods and materials.

As will be described herein, in contrast to substantially U-shaped channels 150a, 150b of the UFETs, FIGS. 18-21 show forming substantially H-shaped channels from precursor structure 100 (FIG. 1), according to embodiments of the disclosure is shown. Referring to FIGS. 22-23, forming GAA FETs including substantially H-shaped channels, according to embodiments of the disclosure is shown. Although two substantially H-shaped channels are shown, any number of substantially H-shaped channels for any number, type and/or combination of GAA FETs may be formed according to embodiments of the disclosure.

Figure 18:
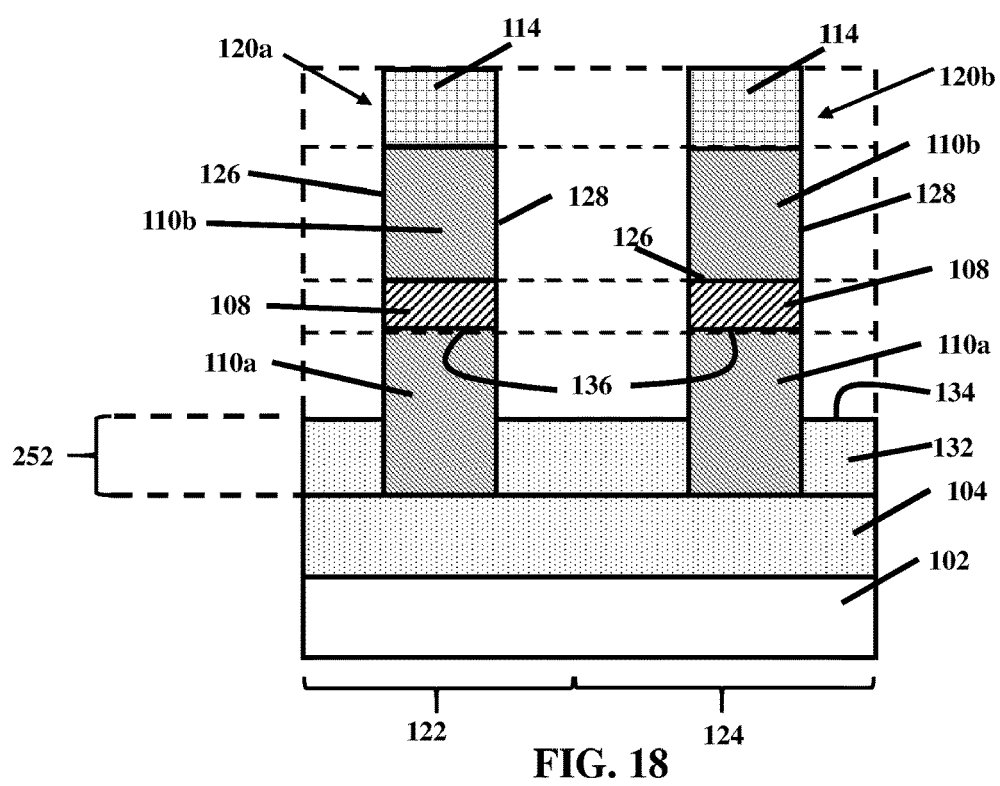
FIG. 18 shows a cross-sectional view of another example of forming a shallow trench isolation (STI) structure on the fin structures of FIGS. 2-3, according to embodiments of the disclosure.

Turning now to FIG. 18, substantially H-shaped channels may be formed from the same and/or similar precursor structure (e.g., precursor structure 100 of FIG. 1) as substantially U-shaped channels 150a, 150b (FIG. 4) discussed above for the UFETs. For example, substantially H-shaped channels may be formed from the same and/or similar fin structures 120a, 120b discussed above with respect to FIG. 4. As also shown in FIG. 18, similarly to forming substantially U-shaped channels, forming substantially H-shaped channels may include forming STI 132 adjacent to fin structures 120a, 120b on exposed portions of the upper surface of BOX layer 104. In contrast to the example of FIG. 3, forming substantially H-shaped channels may include forming STI 132 to cover only a portion 252 of first sacrificial semiconductor layer 110a such that uppermost surface 134 of STI 132 is positioned below bottommost portion 136 of first silicon region 108. As will be discussed herein, forming uppermost surface 134 of STI 132 below bottommost extent 136 of first silicon region 108 may, for example, allow for substantially H-shaped channels to be formed. With the exception of the position of uppermost surface 134 of STI 132, STI 132 may be formed by the same and/or similar processes and materials described above with respect to FIG. 4.

Figure 19:
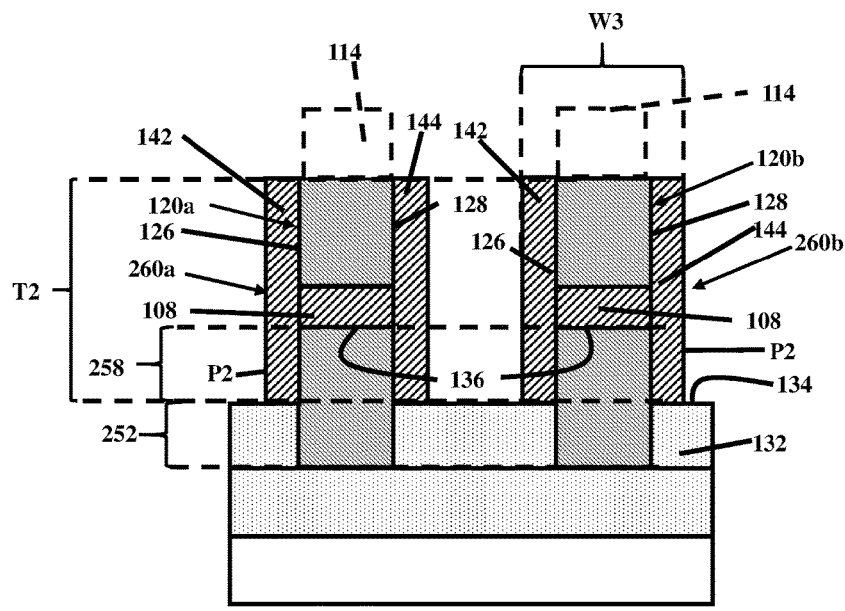
FIG. 19 shows a cross-sectional view of forming substantially H-shaped channels from the fin structures of FIG. 18, according to embodiments of the disclosure.

Turning next to FIG. 19, similarly to forming substantially U-shaped channels as discussed above with respect to FIG. 4, forming substantially H-shaped channels may include forming second and third silicon regions 142, 144 vertically along the sidewalls of fin structures 120a, 120b. For example, second silicon region 142 may be formed to extend substantially vertically along first sidewall 126 of each fin structure 120a, 120b such that the bottommost portion of the second silicon region is positioned on the upper surface of STI 132. Third silicon region 144 may be formed to extend substantially vertically along second sidewall 128 of each fin structure 120a, 120b such that the bottommost portion of the third silicon region is positioned on the upper surface of STI 132. In contrast to the example of FIG. 4, forming substantially H-shaped channels may include forming second silicon region 142 and third silicon region 144 to extend above and below first silicon region 108. For example, as a result of uppermost surface 134 of STI 132 being positioned below bottommost extent 136 of first silicon region 108, a portion 258 of second silicon region 142 and third silicon region 144 may extend below bottommost extent 136 of first silicon region 108. As shown in FIG. 19, second silicon region 142 and third silicon region 144 may each contact the portion of first silicon region 108 exposed at sidewalls 126, 128 of fin structures 120a, 120b to form substantially H-shaped channels 260a, 260b. With the exception of the position of the bottommost surface of second silicon region 142 and third silicon region 144, the structures may be formed by the same and/or similar processes and materials as discussed above with respect to the UFETs.

Similarly to substantially U-shaped channels 150a, 150 of the UFETs, forming a substantially H-shaped channels may allow for a desirable balance between the competing parameters (e.g., width W3, thickness T2, and perimeter P2) of the channel. For example, a width W3 and thickness T2 of channels 260a, 260b may be reduced while maintaining and/or increasing the effective perimeter P2 of the channels. In the example of technology nodes beyond 7 nanometers, width W3 may be approximately 30 nanometers, thickness T2 may be approximately 50 nanometers, and perimeter P2 may be approximately 250 nanometers. Forming substantially H-shaped channels may therefore allow for an increased number of channels to be formed in a defined area of a semiconductor structure, while also improving the performance and stability of the channels and GAA FETs including the channels.

As also shown in FIG. 19, similarly as discussed above with respect to forming substantially U-shaped channels 150a, 150b of FIG. 6, remaining portions of hard mask 114 (in phantom) positioned on the upper surface of fin structures 260a, 260b may be removed for formation of GAA FETs including substantially H-shaped channel 260a, 260b.

Figure 20:
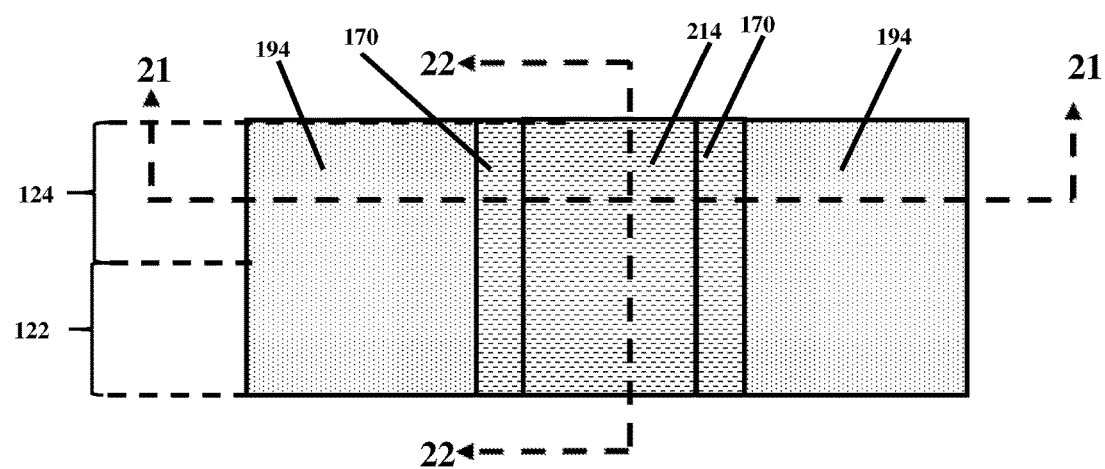
FIG. 20 shows a top or plan view of forming a replacement metal gate structure on the substantially H-shaped channels of FIG. 19, according to embodiments of the disclosure.
Figure 21:
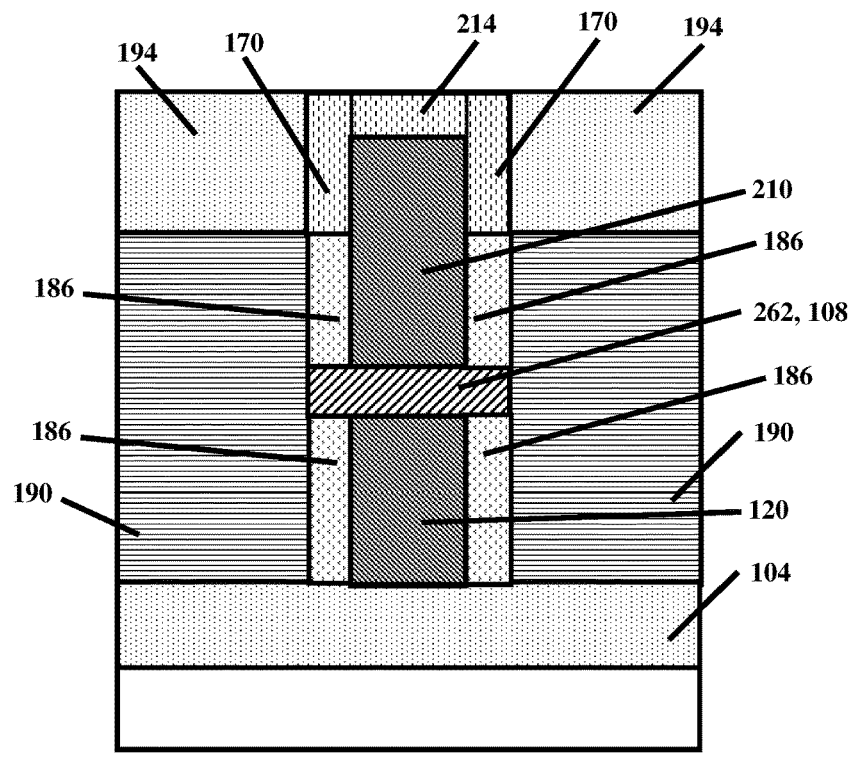
FIG. 21 shows a cross-sectional view of forming the replacement metal gate structure at the same perspective of structure line 21-21 of FIG. 20, according to embodiments of the disclosure.
Figure 22:
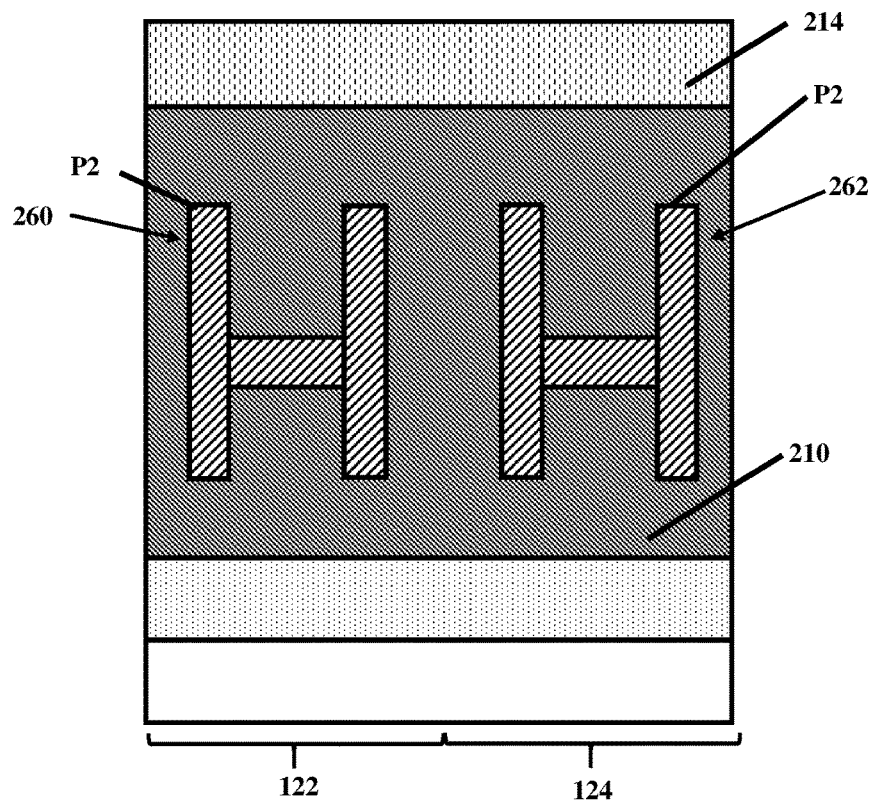
FIG. 22 shows a cross-sectional view of forming the replacement metal gate structure at the same perspective of structure line 22-22 of FIG. 20, according to embodiments of the disclosure.
Figure 23:
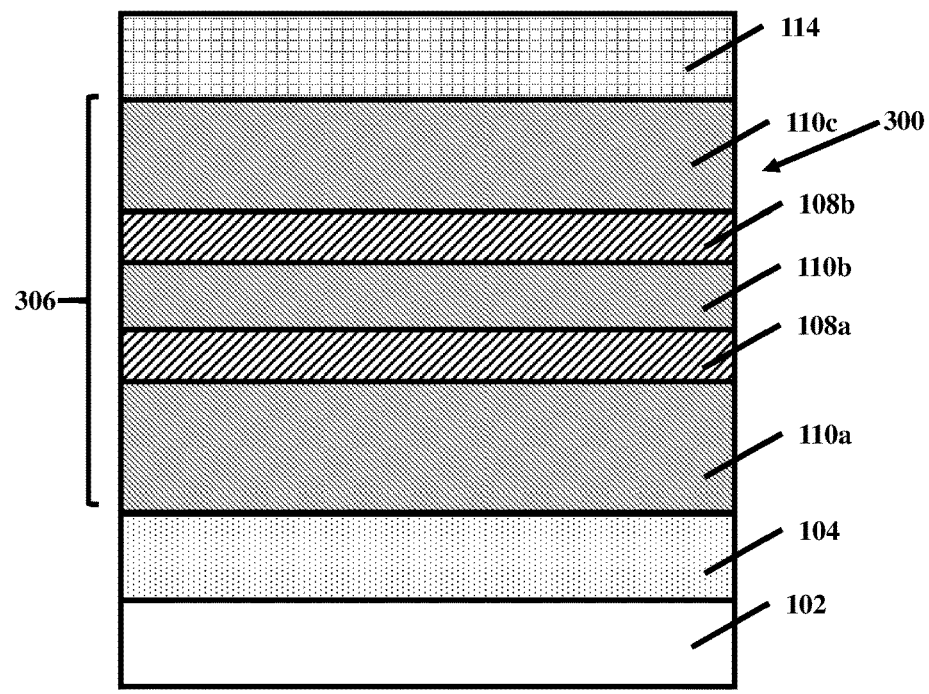
FIG. 23 shows a cross-sectional view of another precursor structure, according to the prior art.

The next group of FIGS. 20-22, with FIG. 21 providing a cross-sectional view of the structure line 21-21 in FIG. 20, and FIG. 22 providing a cross-sectional view of the structure line 22-22 in FIG. 20, show forming GAA FETs including substantially H-shaped channels 260a, 260b of FIG. 19. As shown in FIGS. 21 and 22, the semiconductor structure may include a GAA N-type FET (NFET) 260 in NFET region 122, and a GAA P-type FET (PFET) 262 in PFET region 124 adjacent to the NFET. As shown in FIGS. 20-22, GAA NFET 260 and GAA PFET 262 may include the same and/or similar structures as GAA NFET 218 and GAA PFET 220 of FIG. 17 with the exception of the shape of the channels.

For example, referring to FIG. 22, GAA NFET 260 and GAA PFET 262 may include RMG structure 210 surrounding perimeter P2 of substantially H-shaped channels 260a, 260b. Referring to FIGS. 20-22 together, GAA NFET 260 and GAA PFET 262 may also include RMG cap layer 214 positioned on the upper surface of RMG structure 210, and spacers 170 positioned on substantially H-shaped channels 260a, 260b adjacent to RMG structure 210 and RMG cap layer 214. Referring next to FIG. 21, GAA NFET 260 and GAA PFET 262 may further include source/drain regions 190 positioned on either side of RMG structure 210 such that substantially H-shaped channels 260a, 260b extend between the source/drain regions (e.g., source/drain regions 190 may contact opposing ends of first silicon region 108 as shown in FIG. 21). As also shown in FIG. 21, GAA NFET 260 and GAA PFET 262 may also include inner spacers 186 positioned between source/drain regions 190 and RMG structure 210. As shown in FIGS. 20 and 21, GAA NFET 260 and GAA PFET 262 may include ILD 194 positioned above source/drain regions 190 and adjacent to spacers 170. Forming NFET 260 and PFET 262 may include the same and/or similar processes and/or materials as discussed above with respect to forming NFET 218 and PFET 220 (see FIG. 17) of the UFETs.

Similarly to GAA NFET 218 and GAA PFET 220 of FIG. 17, forming GAA NFET 260 and GAA PFET 262 to include substantially H-shaped channels may, among other things, allow for increased contact area between a gate structure (RMG structure 210) and a channel (substantially H-shaped channels 260a, 260b), increasing performance of the GAA FET. Strictly for purposes of convenience, the processes and structures discussed above with respect to FIGS. 18-22 will be referred to hereinafter as "the HFETs."

Before proceeding to discussion of subsequent processing techniques, structures and accompanying FIGS., it is noted that the various techniques relative to the UFETs may be applied and depicted together in one of FIGS. 23-32, and that the various processing techniques described herein may be combined and/or substituted where appropriate without departing from the underlying technical concepts and characteristics of the present disclosure. It should also be noted that structures described herein with respect to FIGS. 23-32 having the same reference numbers as structures described above with respect to the UFETs may be formed by the same and/or similar methods and include the same and/or similar types of materials. As will be described herein, FIGS. 23-28 show forming stacked, substantially U-shaped channels for a gate-all-around (GAA) complimentary field effect transistor (CFET), and FIGS. 29-32 show forming stacked, substantially H-shaped channels for a GAA CFET.

Turning to FIG. 23, another precursor structure 300, according to embodiments of the disclosure is shown. In contrast to conventional semiconductor structures, precursor structure 300 may include a set of initial materials to be modified into a complimentary field effect transistor (CFET) having stacked, substantially U-shaped and/or H-shaped channels according to the various processes described herein. FIG. 23 provides a cross-sectional view of precursor structure 300. Precursor structure 300 may include substantially similar components and materials as precursor structure 100 of FIG. 1. For example, precursor structure 300 may include BOX layer 104 positioned on substrate 102. Precursor structure 300 may further include a stack 306 including layers of silicon and sacrificial semiconductor material positioned on BOX layer 104. Further, precursor structure 300 may include a hard mask 114 positioned above stack 306.

In contrast to precursor structure 100 of FIG. 1, stack 306 of precursor structure 300 may include two silicon regions 108a, 108b, and three sacrificial semiconductor layers 110a, 110b, 110c for forming stacked channels. For example, stack 306 may include an ordered stack of first sacrificial semiconductor layer 110a, first silicon region 108a, second sacrificial semiconductor layer 110b, second silicon region 108b, and third sacrificial semiconductor layer 110c. Stack 306 may include two silicon regions 108a, 108b, for example, for simultaneously forming a second channel above the first channel according to embodiments of the disclosure. With the exception of the number of sub-structures, precursor structure 300 may be formed by the same and/or similar processes discussed above for similarly numbered structures.

As will be described herein, FIGS. 24-27 show forming stacked, substantially U-shaped channels from precursor structure 300 of FIG. 23, according to embodiments of the disclosure. FIG. 28 shows forming a GAA CFET including the stacked, substantially U-shaped channels.

Figure 24:
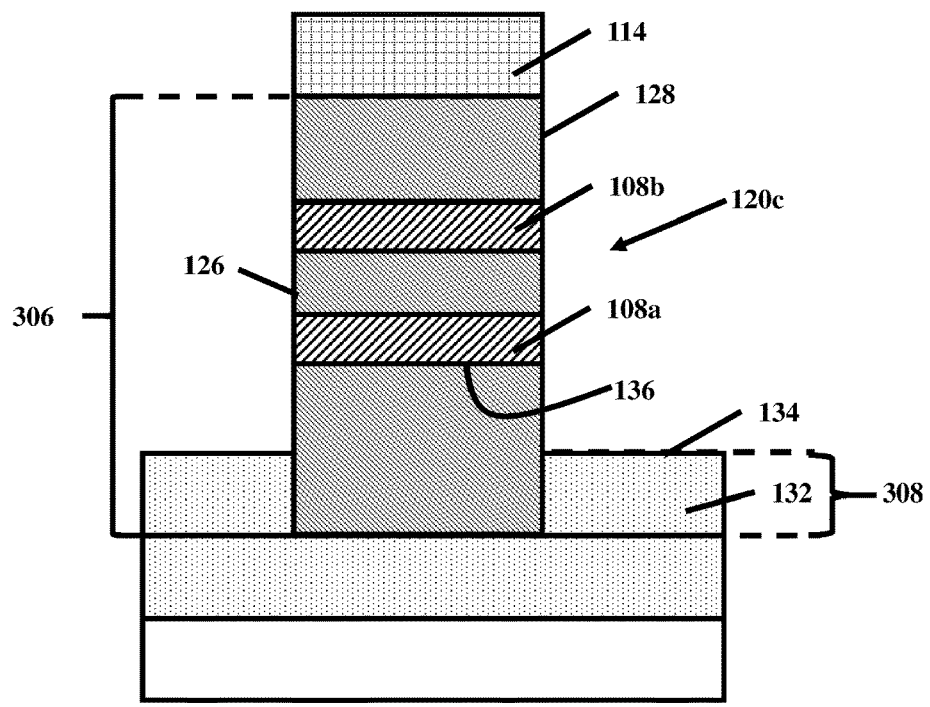
FIG. 24 shows a cross-sectional view of forming another fin structure from the precursor structure of FIG. 23, according to embodiments of the disclosure.

Turning to FIG. 24, similarly to forming substantially U-shaped channels as discussed above with respect to the UFETs, forming stacked, substantially U-shaped channels may include forming a fin structure 120c from precursor structure 300. Fin structure 120c may include a portion of stack 306, and hard mask 114 extending vertically from and positioned on the upper surface of BOX layer 104. Fin structure 120c may include a first sidewall 126 and a second sidewall 128 extending from BOX layer 104. With the exception of the number of fin structures, fin structure 120c may be formed by similar processes as those discussed above with respect to fin structures 120a, 120b of FIGS. 2 and 3. Although one fin structure is shown, it should be understood that any number of fin structures may be formed for any desirable number of GAA CFET structures.

As also shown in FIG. 24, similar to forming substantially U-shaped channels as discussed above with respect to the UFETs, forming stacked, substantially U-shaped channels may include forming STI 132 on BOX layer 104 and adjacent to fin 120c. In contrast to the processes discussed above with respect to the substantially U-shaped channels of the UFETs, as shown in FIG. 24, STI 132 may be formed to cover only a portion 308 of first silicon region 108a. For example, uppermost surface 134 of STI 132 may be positioned below bottommost extent 136 of first silicon region 108a. As will be discussed further herein, forming uppermost surface 134 of STI 132 below the bottommost extent of first silicon region 108 may allow for a first, lower channel to be formed to include a substantially U-shaped cross-section. With the exception of the position of uppermost surface 134, STI 132 may be formed by the same and/or similar processes and materials as discussed above with respect to like numbered structures in FIG. 4.

Figure 25:
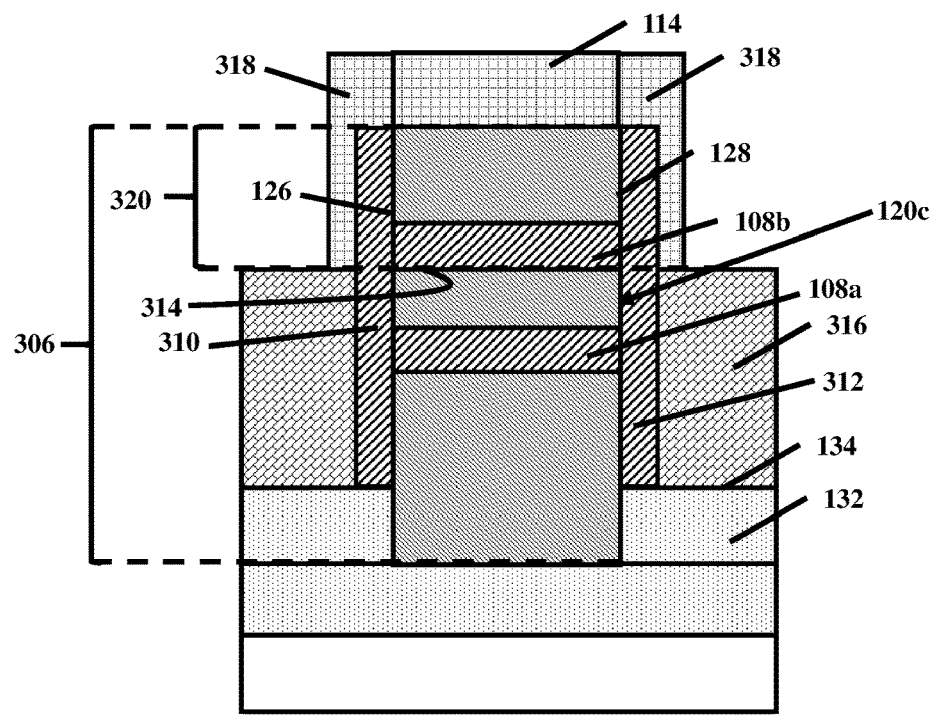
FIG. 25 shows a cross-sectional view of forming additional silicon regions, an organic planarization layer (OPL), and spacers on the fin structure of FIG. 24, according to embodiments of the disclosure.

Turning next to FIG. 25, similarly to forming substantially U-shaped channels in the example of the UFETs, forming stacked, substantially U-shaped channels may include forming additional silicon regions along the sidewalls of the fin structure. For example, a third silicon region 310 may be formed to extend substantially vertically along first sidewall 126 of fin structure 120c such that the bottommost portion of third silicon region 310 is positioned on uppermost surface 134 of STI 132. A fourth silicon region 312 may be formed to extend substantially vertically along second sidewall 128 of fin structure 120c such that the bottommost portion of fourth silicon region 312 is positioned on uppermost surface 134 of STI 132. In contrast to silicon regions 142, 144 of FIG. 4, third silicon region 310 and fourth silicon region 312 may each contact two silicon regions (first silicon region 108a and second silicon region 108b) of stack 306 exposed on sidewalls 126, 128 of fin structure 120c. As will be discussed herein, forming third and fourth silicon regions 310, 312 to contact first and second silicon regions 108a, 108b may allow for formation of two, stacked channels. Third and fourth silicon regions 310, 312 may be formed by the same and/or similar processes and materials as discussed above with respect to second silicon region 142 and third silicon region 144 of FIG. 4.

As also shown in FIG. 25, in contrast to the processes discussed above with respect to the UFETs, forming stacked, substantially U-shaped channels may include forming an organic planarization layer (OPL) 316 on uppermost surface 134 of STI 132 adjacent to fin structure 120c. OPL 316 may be formed to protect semiconductor materials covered by the OPL from being removed, etched, altered, etc., during subsequent processing (e.g., during the removal of portions of third and fourth silicon regions 310, 312). As shown in FIG. 25 and will be discussed in greater detail herein, the upper surface of OPL 316 may be formed substantially co-planar with bottommost extent 314 of second silicon region 108b for controlling the removal of portions of third and fourth silicon regions 310, 312. OPL 316 may be formed by conventional semiconductor fabrication techniques for forming an OPL layer. For example OPL 316 may be formed by spin-on coating. OPL 316 may include a conventional semiconductor OPL.

As also shown in FIG. 25, in contrast to the processes described above with respect to the UFETs, forming stacked, substantially U-shaped channels may include forming spacers 318 on an exposed portion 320 of silicon regions 310, 312 above OPL 316 and adjacent to hard mask 114. Spacers 318 may be formed to protect portion 320 of silicon regions 310, 312 from damage during subsequent processing. For example, spacers 318 may protect portion 320 of silicon regions 310, 312 during removal of portions 328 (FIG. 26) of silicon regions 310, 312. As shown in FIG. 25, as a result of the upper surface of OPL 316 being positioned substantially co-planar with bottommost extent 314 of second silicon region 108b, the bottommost surface of spacers 318 may be substantially co-planar with the bottommost extent of second silicon region 108b. Positioning the bottommost surface of spacers 318 substantially co-planar with the bottommost extent 314 of second silicon region 108b may, for example, control the portions of third and fourth silicon regions 310, 312 removed during subsequent processing to form stacked, substantially U-shaped channels. Spacers 318 may be formed by conventional semiconductor fabrication processes for forming a spacer. For example, spacers 318 may be formed by atomic layer deposition (ALD) of dielectric liner material followed by anisotropic etch back. Spacers 318 may include conventional semiconductor materials for spacers. For example, spacers 318 may include without limitation silicon nitride (SiN). In the non-limiting example of FIG. 25, spacers 318 may include the same or substantially the same material as hard mask 114.

Figure 26:
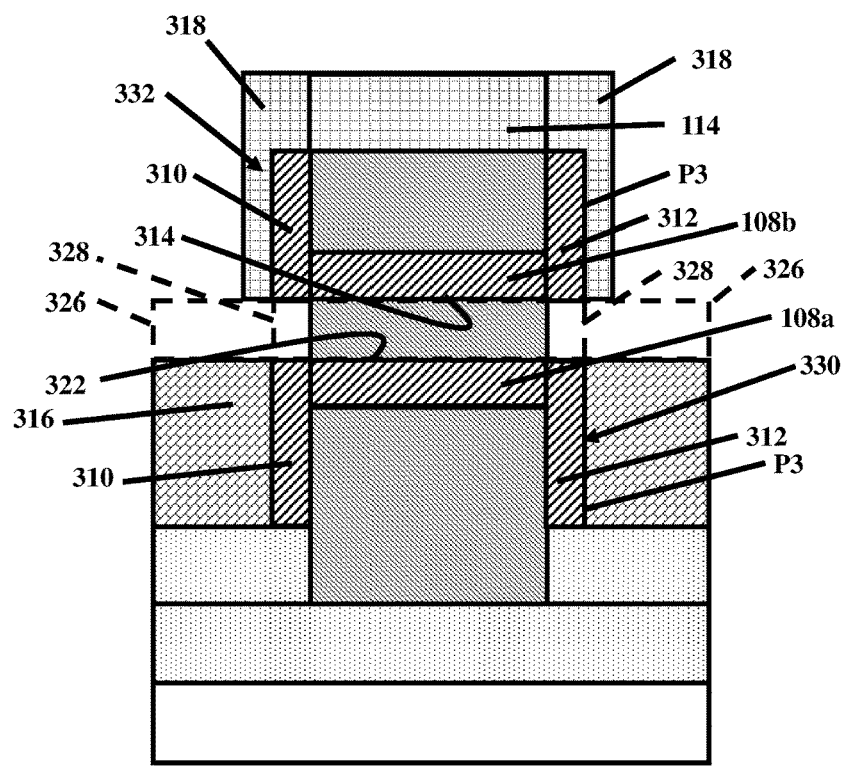
FIG. 26 shows a cross-sectional view of forming stacked, substantially U-shaped channels from the structure of FIG. 25, according to embodiments of the disclosure.

Turning now to the example of FIG. 26, forming stacked, substantially U-shaped channels for a GAA CFET is shown. Forming stacked, substantially U-shaped channels may include removing portions 326 (in phantom) of OPL 316, and portions 328 (in phantom) of third and fourth silicon regions 310, 312 positioned between bottommost extent 314 of second silicon region 108b, and the uppermost extent 322 of first silicon region 108a. Removing portions 326 (in phantom) and portions 328 (in phantom) may, for example, form two vertically stacked channels 330, 332. As shown in FIG. 26 channels 330, 332 may be substantially U-shaped, with the substantial U-shape of channel 330 being inverted. Similarly to the substantially U-shaped channels described above with respect to the UFETs, forming stacked channels 330, 332 as substantially U-shaped may, for example, allow for a desirable balance between the competing parameters of the channel. For example, forming stacked, substantially U-shaped channels may allow for a larger number of channels to be stacked in a defined area, and reduce the risk of channel shorting while also improving the performance and stability of the GAA CFET including the channels.

Portions 326 (in phantom) and portions 328 (in phantom) may be removed, for example, by conventional semiconductor fabrication techniques for removing OPL material and silicon. In the example of FIG. 26, portions 326 (in phantom) and portions 328 (in phantom) may be removed by plasma dry etch processes. As also shown in FIG. 26, spacers 318, hard mask 114, and the remainder of OPL 316 may protect the remainder of the semiconductor structure during the removal of portions 326 (in phantom) and portions 328 (in phantom).

Figure 27:
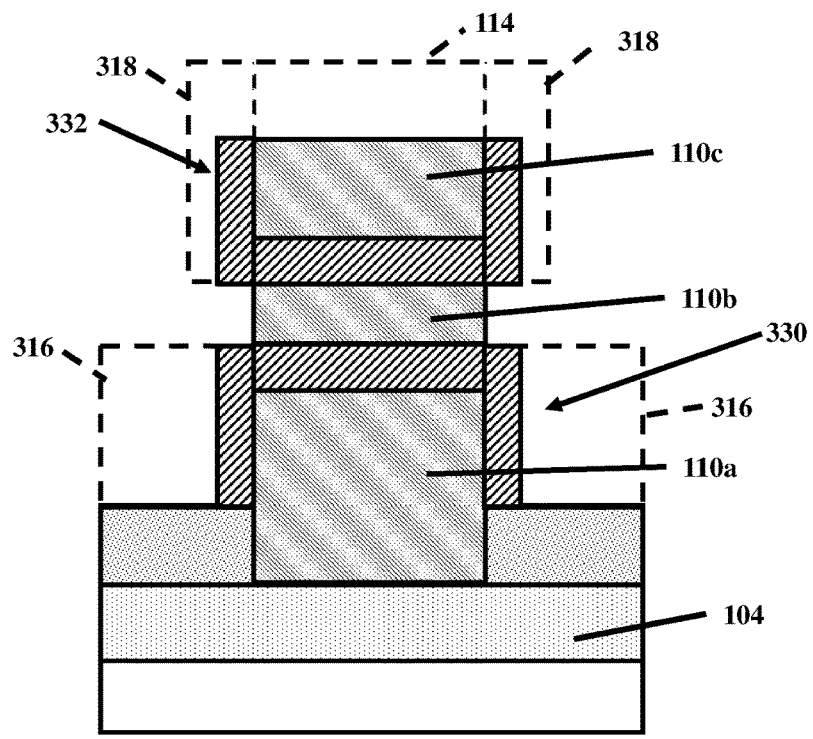
FIG. 27 shows a cross-sectional view of removing the OPL and spacers from the structure of FIG. 26, according to embodiments of the disclosure.
Figure 28:
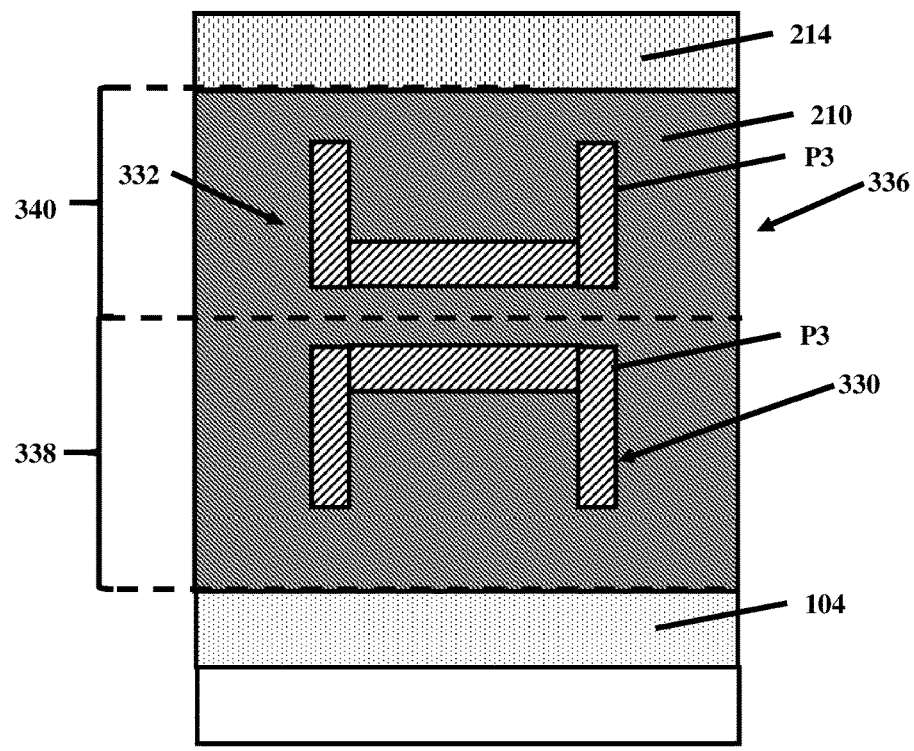
FIG. 28 shows a cross-sectional view of forming a replacement metal gate structure around the stacked, substantially U-shaped channels of FIG. 27, according to embodiments of the disclosure.

Turning now to FIGS. 27 and 28, forming a GAA CFET including stacked, substantially U-shaped channels is shown. Referring to FIG. 27, after removing portions 326, 328 (FIG. 26, in phantom), forming a GAA CFET may include, for example, removing the remainder of hard mask 114 (in phantom), spacers 318 (in phantom), and OPL 316 (in phantom). Removing the remainder of hard mask 114 (in phantom), spacers 318 (in phantom), and OPL 316 (in phantom) may, for example, expose channels 330, 332 and sacrificial semiconductor layers 110*b*, 110*c* for subsequent processing to form a GAA CFET. The remainder of hard mask 114 (in phantom), spacers 318 (in phantom), and OPL 316 (in phantom) may be removed by conventional semiconductor fabrication techniques for removing hard mask material, spacer material, OPL material, and STI material. For example, the remainder of hard mask 114 (in phantom) and spacers 218 (in phantom) may be removed by phosphoric acid we etching; and OPL may be removed by ashing.

Referring now to FIG. 28, forming a GAA CFET 336 may include forming a PFET 338 including channel 330, and an NFET 340 including channel 332. As shown in FIG. 28, PFET 338 and NFET 340 of GAA CFET 336 may include the same and/or similar structures as NFET 218 and PFET 220 of FIG. 17, with the exception of the location, geometry and orientation of the channels. Although the steps between forming stacked, substantially U-shaped channels 330, 332 and the additional structures of GAA CFET 336 are not shown, it is understood that the structures may be formed by the same and/or similar methods and materials as similarly number structures discussed above relative to FIGS. 1-22. For example, GAA CFET 336 may include RMG structure 210 surrounding perimeter P3 of stacked, substantially U-shaped channels 330, 332. GAA CFET 336 may also include RMG cap layer 214 positioned on the upper surface of RMG structure 210. Although not shown in the cross-section of FIG. 28, GAA CFET 336 may also include spacers, inner spacers, and source/drain region into and/or out of the plane of FIG. 28, similarly to spacers 170, inner spacers 186, and source/drain regions 190 of FIG. 16. With the exception of the location, geometry, and orientation of the channels, forming GAA CFET 336 may include the same and/or similar processes and/or materials as discussed above with respect to forming PFET 220 (see FIG. 17) of the UFETs.

Among other things, forming GAA CFET 336 to include stacked, substantially U-shaped channels may, for example, allow for increased contact area between a gate structure (RMG structure 210) and stacked channels (stacked, substantially U-shaped channels 330, 332) to increase performance of the GAA CFET. Strictly for purposes of convenience, the processes and structures discussed above with respect to FIGS. 23-28 will be referred to hereinafter as "the stacked UFETs."

Before proceeding to discussion of subsequent processing techniques, structures and accompanying FIGS., it is noted that the various techniques relative to the UFETs, HFETs, and/or stacked UFETs may be applied and depicted together in one of FIGS. 29-32, and that the various processing techniques described herein may be combined and/or substituted where appropriate without departing from the underlying technical concepts and characteristics of the present disclosure. It is again emphasized that the processes discussed herein and shown in the accompanying FIGS. 29-32 reflect a similar set of processing concepts with possible variances in implementation discussed herein. It should also be noted that structures described herein with respect to FIGS. 29-32 having the same references numbers as structures described above with respect to the UFETS, the HFETs, and/or the stacked UFETs may be formed by the same methods and include the same and/or similar types of materials.

Figure 29:
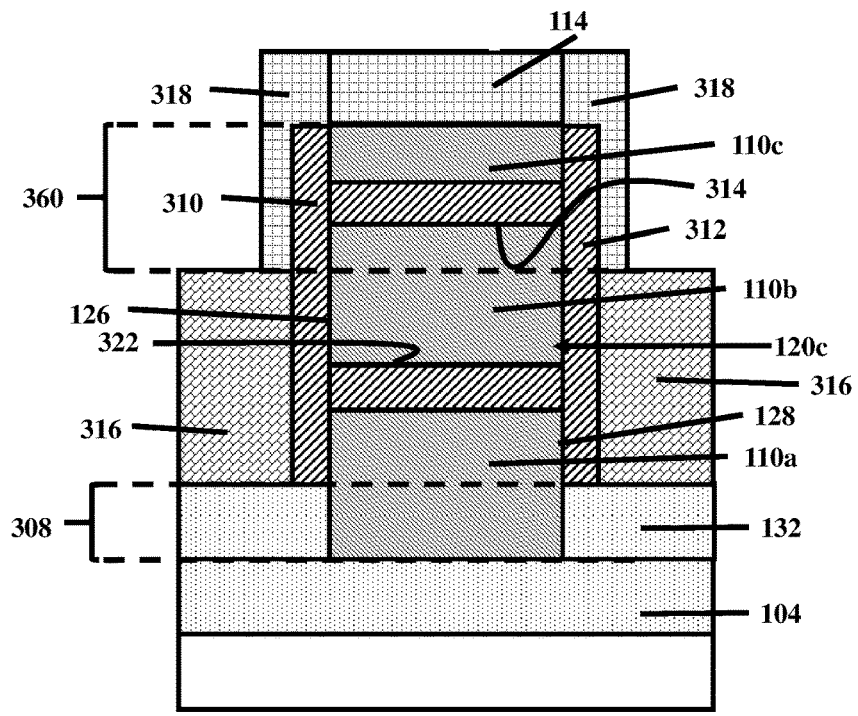
FIG. 29 shows a cross-sectional view of another example of forming additional silicon regions, an organic planarization layer (OPL), and spacers on the fin structure of FIG. 24, according to embodiments of the disclosure.
Figure 30:
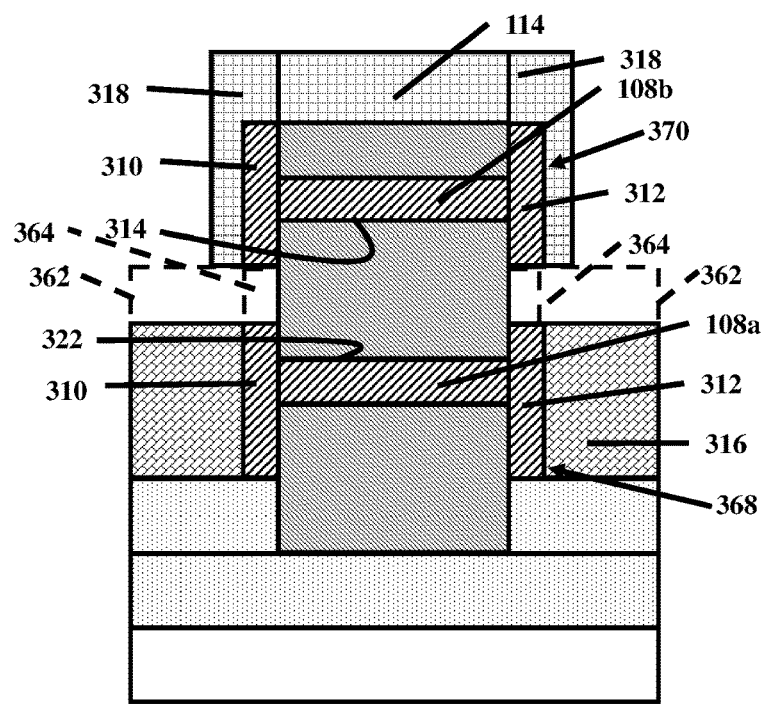
FIG. 30 shows a cross-sectional view of forming stacked, substantially H-shaped channels from the structure of FIG. 29, according to embodiments of the disclosure.
Figure 31:
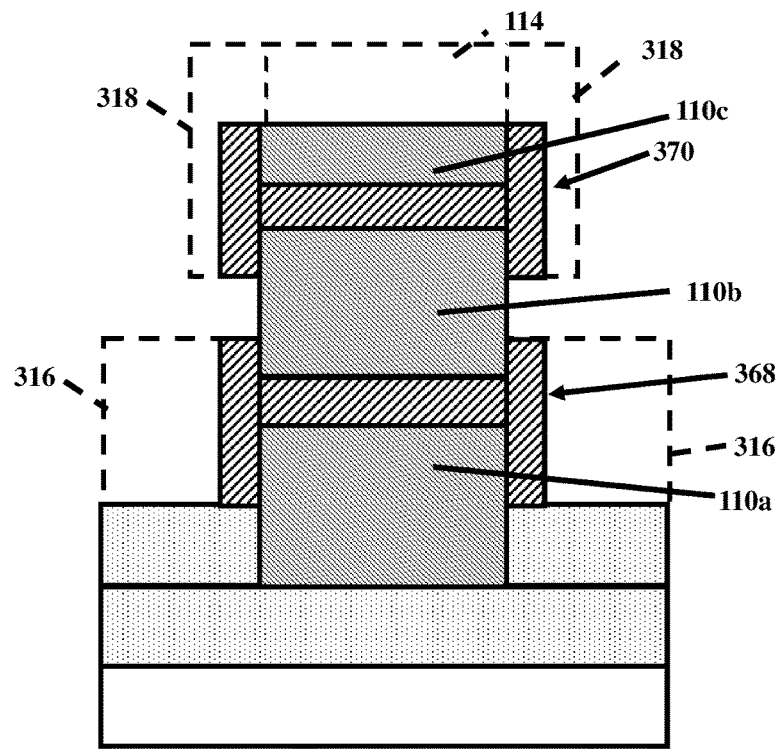
FIG. 31 shows a cross-sectional view of removing the OPL and spacers from the structure of FIG. 30, according to embodiments of the disclosure.
Figure 32:
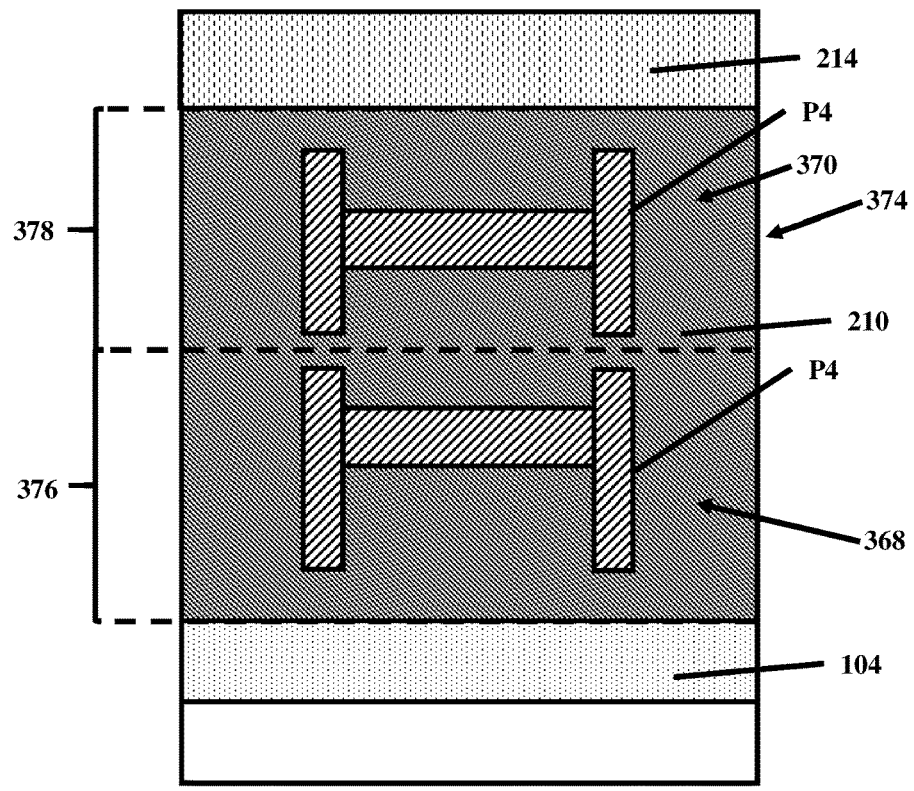
FIG. 32 shows a cross-sectional view of forming a replacement metal gate structure around the stacked, substantially H-shaped channels of FIG. 31, according to embodiments of the disclosure.

As will be described herein, FIGS. 29-31 show forming substantially H-shaped channels from precursor structure 300 of FIG. 23, according to embodiments of the disclosure. Referring to FIG. 32, forming a GAA CFET including the stacked, substantially H-shaped channels, according to embodiments of the disclosure is shown. Although one GAA CFET including two, stacked, substantially H-shaped channels is shown, any number of GAA CFETs may be formed according to embodiments of the disclosure.

Turning now to FIG. 29, forming stacked, substantially H-shaped channels may include forming the same and/or similar fin structure (e.g., fin structure 102*c* of FIG. 24) from precursor structure 300 (FIG. 23) discussed above with respect to forming stacked, substantially U-shaped channels. For example, forming stacked, substantially H-shaped channels may include forming shallow trench isolation (STI) 132 adjacent to fin structure 120*c* and covering the upper surface of BOX layer 104 and portion 308 of first sacrificial semiconductor layer 110*a*. As also shown in FIG. 29, similarly to stacked, substantially U-shaped channels 330, 332 discussed above with respect to FIGS. 23-28, forming stacked, substantially H-shaped channels for a GAA CFET may include forming third silicon region 310 and fourth silicon region 312 along the sidewalls of fin structure 120*c*.

As further shown in FIG. 29, in contrast to the processes discussed above with respect to the UFETs and HFETs, and similarly to the processes discussed above with respect to the stacked UFETs, forming stacked, substantially H-shaped channels may include forming organic planarization layer (OPL) 316 on STI 132 adjacent to fin structure 120*c*. In contrast to forming the stacked UFETs, as shown in the example of FIG. 29, OPL 316 may be formed such that the upper surface of the OPL is positioned below bottommost extent 314 of second silicon region 108*b*. As will be discussed further herein, forming OPL 316 such that the upper surface of the layer is positioned below bottommost extent 314 of second silicon region 108*b* may allow for stacked channels having a substantially H-shaped cross-section to be formed. With the exception of the positioning of the upper surface of OPL 316, the structure may be formed by the same and/or similar processes and materials as discussed above with respect to OPL 316 of the example of FIG. 25.

Referring again to FIG. 29, in contrast to the processes described above with respect to the UFETs and HFETs, and similarly to the processes discussed above with respect to the stacked UFETs, forming stacked, substantially H-shaped channels may include forming spacers 318 on an exposed portion 360 of third and fourth silicon regions 310, 312 above OPL 316 and adjacent to hard mask 114. In contrast to forming the stacked UFETs discussed above, as a result of forming the upper surface of OPL 316 below bottommost extent 314 of second silicon region 108*b*, the bottommost surface of spacers 318 may be positioned below bottommost extent 314 of second silicon region 108*b*. The position of the bottommost surface of spacers 318 may control the portions of third and fourth silicon regions 310, 312 removed during subsequent processing. Positioning the bottommost surface of spacers 318 below the bottommost extent of second silicon region 108*b* may, for example, allow for channels to be formed with substantially H-shaped cross-sections. With the exception of the position of the bottommost surface, spacers 318 may be formed by the same and/or similar processes and materials as described above with respect to the example of FIG. 25.

Turning next to the example of FIG. 30, similarly to forming stacked, substantially U-shaped channels, portions of OPL 316, and third and fourth silicon regions 310, 312 may be removed to form stacked, substantially H-shaped channels. For example, as shown in FIG. 30, portions 362 (in phantom) of OPL 316, and portions 364 (in phantom) of third and fourth silicon regions 310, 312 may be removed. As shown in the example of FIG. 30, in contrast to portions 326, 328 of FIG. 26, portions 362, 364 (in phantom) may be positioned between bottommost extent 314 of second silicon region 108b, and uppermost extent 322 of first silicon region 108a. Removing portions 362, 364 (in phantom) may form two vertically stacked channels 368, 370. In contrast to the example of FIG. 26 of forming the stacked UFETs, as a result of portions 362, 364 (in phantom) being positioned below bottommost extent 314 of second silicon region 108b and above uppermost extent 316 of first silicon region 108a, channels 368, 370 may be substantially H-shaped. Similarly to the substantially H- and/or U-shaped channels discussed above with respect to UFETs, HFETS, and stacked UFETs, forming stacked channels 368, 370 as substantially H-shaped may, for example, allow for a desirable balance between the competing parameters of the channel. For example, forming stacked, substantially H-shaped channels may allow for a larger number of channels to be stacked in a defined area. Additionally, forming a GAA CFET including stacked, substantially H-shaped channels may reduce the risk of channel shorting, and improve the performance and stability of the GAA CFET.

Portions 362, 364 (in phantom) may be removed by the same and/or similar processes as discussed above with respect to portions 328, 326 in the example of FIG. 26. As also shown in FIG. 30, the spacers 318, hard mask 114, and the remainder of OPL 316 may protect the remainder of the semiconductor structure during the removal of portions 362 (in phantom) and portions 364 (in phantom).

Referring to FIG. 31, similarly to forming the stacked UFETs as discussed above with respect to FIG. 27, forming a GAA CFET including stacked, substantially H-shaped channels may also include, for example, removing hard mask 114 (in phantom), spacers 318 (in phantom), and OPL 316 (in phantom). Removing hard mask 114 (in phantom), spacers 318 (in phantom), and OPL 316 (in phantom), may expose channels 368, 370 and sacrificial semiconductor layer 110c for subsequent processing for forming a GAA CFET structure. —Turning now to FIG. 32, forming a GAA CFET 374 including stacked, substantially H-shaped channels 368, 370 of FIG. 30 is shown. For example, GAA CFET 374 may be formed to include a PFET 376 including channel 368, and a NFET 378 including channel 370. PFET 376 and NFET 378 of GAA CFET 374 may include the same and/or similar structures as NFET 218 and PFET 220 of the UFETs of FIG. 17, with the exception of the location, geometry, and orientation of the channels. Although the steps between forming stacked, substantially H-shaped channels 368, 370 and the additional structures of GAA CFET 374 are not shown, it is understood that the structures may be formed by the same and/or similar methods and materials as similarly number structures discussed above relative to FIGS. 1-22. For example, as shown in the example of FIG. 32, GAA CFET 374 may include RMG structure 210 surrounding perimeter P4 of stacked, substantially H-shaped channels 368, 370, and RMG cap layer 214 positioned on the upper surface of RMG structure 210. Although not shown in the cross-section of FIG. 32, GAA CFET 374 may also include spacers, inner spacers, and source/drain region into and/or out of the plane of FIG. 28, similar to spacers 170, inner spacers 186, and source/drain regions 190 of FIG. 16. The structure of PFET 376 and NFET 378 of GAA CFET 374 may be formed by the same and/or similar processes and/or materials as discussed above with respect to forming PFET 220 (see FIG. 17) of the UFETs, with the exception of the location, geometry, and orientation of channels 368, 370.

Among other things, forming GAA CFET 374 to include stacked, substantially H-shaped channels may, for example, allow for increased contact area between a gate structure (RMG structure 210) and a channel (stacked, substantially H-shaped channels 368, 370), increasing performance of the GAA CFET.

Although FIGS. 1-32 show forming FETs having substantially U-shaped and/or H-shaped channel(s) in a specific number, orientation, location and/or combination, it is understood that any number, orientation, location and combination of substantially U-shaped and/or H-shaped channels may be formed according to embodiments of the disclosure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). As used herein, the term "substantially H-shaped may refer to a shape having three major line segments in the shape of the letter 'H' but with some variation in the shape of the segments and/or the number of minor line segments. As used herein, the term "substantially U-shaped may refer to a shape having three major line segments in the shape of the letter 'U' but with some variation in the shape of the segments and/or the number of minor line segments.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a fin structure having a first sidewall, and a second sidewall above a substrate, the fin structure including:
     a first sacrificial semiconductor layer above the substrate,
     a first silicon region on the first sacrificial semiconductor layer, and
     a second sacrificial semiconductor layer on the first silicon region;
   forming a shallow trench isolation (STI) above the substrate adjacent to the fin structure, wherein an uppermost surface of the STI is positioned below a bottommost extent of the first silicon region;
   forming a second silicon region extending vertically along the first sidewall of the fin structure, the second silicon region contacting a first surface of the first silicon region;
   forming a third silicon region extending vertically along the second sidewall of the fin structure, the third silicon region contacting a second surface the first silicon region;
   forming a dummy gate structure on a first portion of the fin structure, the second silicon region and the third silicon region;
   removing an exposed portion of the fin structure, the second silicon region and the third silicon region free from the dummy gate structure;
   replacing a portion of the first sacrificial semiconductor layer and the second sacrificial semiconductor layer positioned under the dummy gate structure with a spacer material layer;
   forming a source/drain region from the first silicon region;
   removing a remainder of the first sacrificial semiconductor layer and the second sacrificial semiconductor layer; and
   replacing a portion of the dummy gate structure with a replacement metal gate (RMG) body surrounding the first silicon region, the second silicon region and the third silicon region.

2. The method of claim 1, wherein the dummy gate structure includes:
   a dummy body having sidewalls, and
   spacers on the sidewalls of the dummy body, and
   wherein the portion of the first sacrificial semiconductor layer and the second sacrificial semiconductor layer replaced by the spacer material layer is a portion of the first sacrificial semiconductor layer and the second sacrificial semiconductor layer positioned under the spacers of the dummy gate structure.

3. The method of claim 2, further comprising before removing the remainder of the first sacrificial semiconductor layer and the second sacrificial semiconductor layer, removing the dummy body of the dummy gate structure and the STI.

4. The method of claim 1, wherein the first sacrificial semiconductor layer and the second sacrificial semiconductor layer comprise silicon germanium (SiGe).

5. The method of claim 1, wherein forming the STI includes allowing a portion of the first sacrificial semiconductor layer below the first silicon region to remain exposed, and wherein a cross-sectional geometry of the first silicon region, the second silicon region, and the third silicon region together is substantially H-shaped.

6. The method of claim 1, wherein forming the STI includes forming the STI to cover the first sacrificial semiconductor layer below the first silicon region, and a cross-sectional geometry of the first silicon region, the second silicon region, and the third silicon region together is substantially U-shaped.

7. The method of claim 1, wherein the forming the second silicon region includes epitaxially growing the first surface of the first silicon region at the first sidewall.

8. The method of claim 1, wherein the forming the third silicon region includes epitaxially growing the second surface of the first silicon region at the second sidewall.

9. A method comprising:
   forming a first isolation material layer on an uppermost surface of a substrate of the semiconductor structure;
   forming a fin structure having a first sidewall, and a second sidewall on the first isolation material layer, the fin structure including:
     a first sacrificial semiconductor layer on the first isolation material layer, a first silicon region on the first sacrificial semiconductor layer, a second sacrificial semiconductor layer on the first silicon region, a second silicon region on the second sacrificial semiconductor layer, and a third sacrificial semiconductor layer on the second silicon region;

forming a third silicon region extending vertically along the first sidewall of the fin structure, the third silicon region contacting a first surface of the first silicon region and the second silicon region at the first sidewall;

forming a fourth silicon region extending vertically along the second sidewall of the fin structure, the fourth silicon region contacting a second surface of the first silicon region and the second silicon region at the second sidewall;

forming an organic planarization layer (OPL) above the first isolation material layer and adjacent to the third silicon region and the fourth silicon region, wherein an upper surface of the OPL is positioned above an uppermost extent of the first silicon region;

forming spacers above the OPL and on the fin structure, the third silicon region, and the fourth silicon region, wherein a bottommost surface of the spacers is positioned on the upper surface of the OPL;

removing an upper portion of the OPL positioned below the spacers to expose a portion of the third silicon region and the fourth silicon region; and removing a portion of the third silicon region and the fourth silicon region positioned between the first silicon region and the second silicon region to form a first, lower channel and a second, upper channel positioned, the second, upper channel positioned above the first, lower channel.

10. The method of claim 9, wherein the first, lower channel and the second, upper channel include one of a substantially U-shaped cross-sectional geometry and a substantially H-shaped geometry.

11. The method of claim 9, further comprising before forming the third silicon region and the fourth silicon region, forming a shallow trench isolation (STI) on the first isolation material layer adjacent to the fin structure, wherein an uppermost surface of the STI is positioned below a bottommost extent of the first silicon region.

\* \* \* \* \*